US012787898B2

(12) United States Patent
Chen et al.

(10) Patent No.: US 12,787,898 B2
(45) Date of Patent: Nov. 3, 2026

(54) DEVICE COMPRISING WALL PILLAR INTERCONNECTS

(71) Applicant: QUALCOMM Incorporated, San Diego, CA (US)

(72) Inventors: Yujen Chen, Taichung (TW); Aniket Patil, San Diego, CA (US); Zhijie Wang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 338 days.

(21) Appl. No.: 18/747,099

(22) Filed: Jun. 18, 2024

(65) Prior Publication Data

US 2025/0385169 A1 Dec. 18, 2025

(51) Int. Cl.
*H10W 90/00* (2026.01)
*H10W 20/41* (2026.01)

(52) U.S. Cl.
CPC ....... *H10W 90/701* (2026.01); *H10W 20/427* (2026.01); *H10W 20/435* (2026.01)

(58) Field of Classification Search
CPC ............... H10W 90/701; H10W 72/20; H10W 72/221; H10W 20/435; H10W 20/427
See application file for complete search history.

(56) References Cited

U.S. PATENT DOCUMENTS

2005/0233571 A1 10/2005 Tao et al.
2015/0371964 A1* 12/2015 Cha .................... H10W 20/069 257/737
2016/0079171 A1* 3/2016 Yeh .................... H10W 42/121 257/532
2016/0211206 A1* 7/2016 Lee ...................... H10W 70/05
2018/0122761 A1* 5/2018 Huang ................. H10W 72/20
2018/0366440 A1 12/2018 Chen et al.
2021/0407948 A1 12/2021 Kim et al.
2022/0068870 A1* 3/2022 Pak ........................ H10P 72/74

FOREIGN PATENT DOCUMENTS

JP 4828235 B2 11/2011

OTHER PUBLICATIONS

International Search Report and Written Opinion—PCT/US2025/032532—ISA/EPO—Sep. 22, 2025.

* cited by examiner

*Primary Examiner* — Changhyun Yi
(74) *Attorney, Agent, or Firm* — Loza & Loza, LLP

(57) ABSTRACT

A package comprising a substrate and a passive device coupled to the substrate through a plurality of solder interconnects. The substrate comprises at least one dielectric layer; and a plurality of interconnects. The passive device comprises a die substrate; a plurality of under bump metallization interconnects; and a plurality of pillar interconnects coupled to the plurality of under bump metallization interconnects, wherein at least one pillar interconnect comprises a wall pillar interconnect.

20 Claims, 16 Drawing Sheets

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

CROSS SECTIONAL PROFILE VIEW

PLAN VIEW

*PLAN VIEW*

PLAN VIEW

PLAN VIEW

DEVICE COMPRISING WALL PILLAR INTERCONNECTS

FIELD

Various features relate to passive devices and/or integrated devices.

BACKGROUND

A package may include a substrate, a passive device and integrated devices. These components are coupled together to provide a package that may perform various electrical functions. The performance of integrated devices and/or packages and its components may depend on various factors, including the number of interconnects in the packages and/or the integrated devices. There is an ongoing need to improve the performance of integrated devices and/or packages, while also improving and keeping the form factor of integrated devices and/or packages as small as possible.

SUMMARY

Various features relate to passive devices and/or integrated devices.

One example provides a device comprising a die substrate; a plurality of under bump metallization interconnects; and a plurality of pillar interconnects coupled to the plurality of under bump metallization interconnects, wherein at least one pillar interconnect comprises a wall pillar interconnect.

Another example provides a package comprising a substrate and a passive device coupled to the substrate through a plurality of solder interconnects. The substrate comprises at least one dielectric layer; and a plurality of interconnects. The passive device comprises a die substrate; a plurality of under bump metallization interconnects; and a plurality of pillar interconnects coupled to the plurality of under bump metallization interconnects, wherein at least one pillar interconnect comprises a wall pillar interconnect.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown as block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate and a passive device coupled to the substrate through a plurality of solder interconnects. The substrate comprises at least one dielectric layer; and a plurality of interconnects. The passive device comprises a die substrate; a plurality of under bump metallization interconnects; and a plurality of pillar interconnects coupled to the plurality of under bump metallization interconnects, wherein at least one pillar interconnect comprises a wall pillar interconnect. The use of one or more wall pillar interconnects and/or one or more wall under bump metallization interconnects may help provide improved mechanical coupling between a passive device and a substrate. This may negate the need for a underfill between the passive device and the substrate. Thus, the package may be free of an underfill in a region located vertically between the passive device and the substrate.

Exemplary Device Comprising Wall Pillar Interconnects

Figure 1:
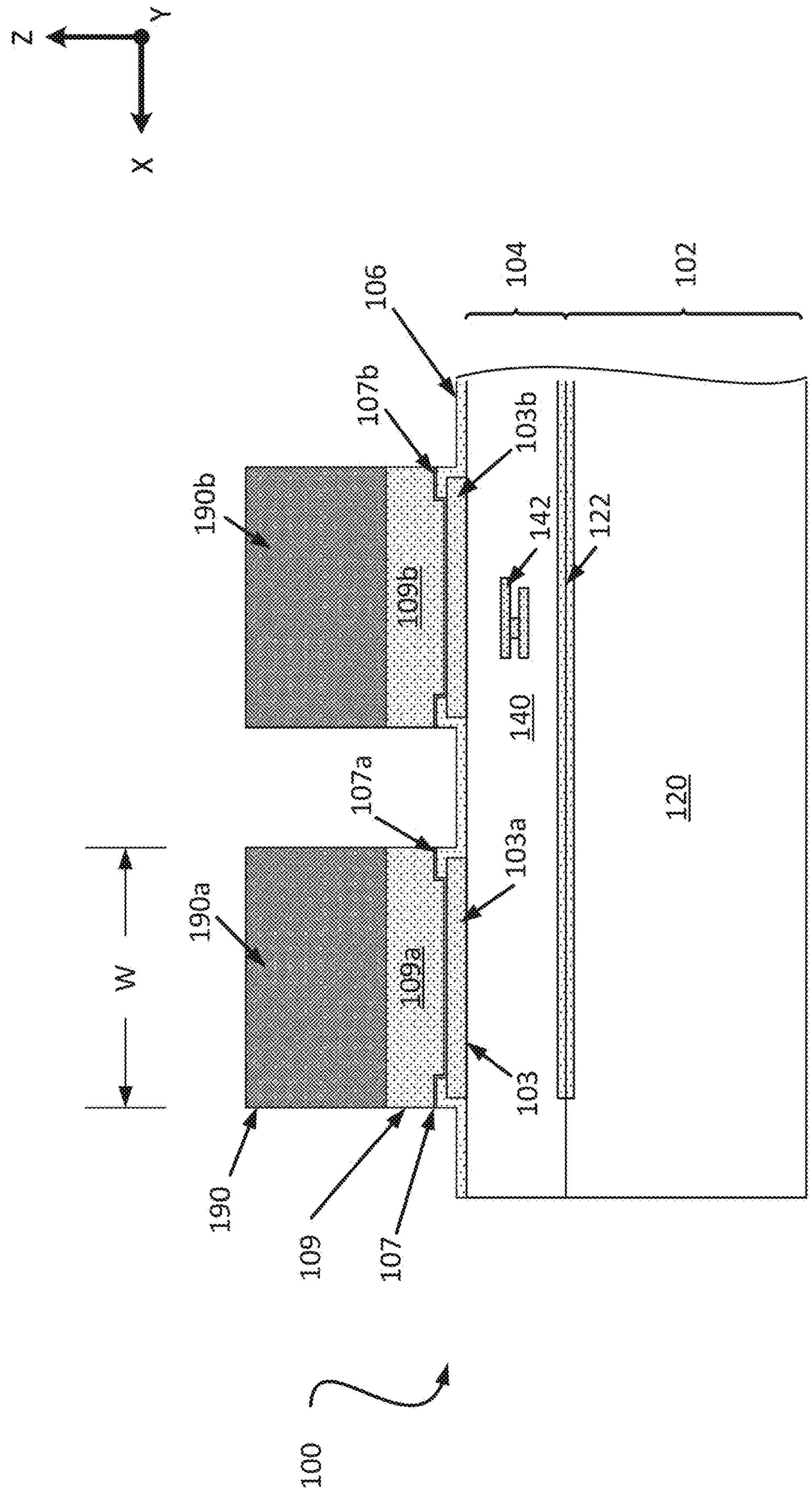
FIG. 1 illustrates a cross sectional profile view of an exemplary device that includes wall pillar interconnects.

FIG. 1 illustrates a cross sectional profile view of a device 100 that includes pillar interconnects, where at least some of the pillar interconnects are configured as wall pillar interconnects. The device 100 may include an integrated device. The device 100 includes a die substrate portion 102, a die interconnection portion 104, a plurality of pad interconnects 103, a plurality of under bump metallization interconnects 107, a plurality of pillar interconnects 109, a plurality of solder interconnects 190, and/or a passivation layer 106. One or more of the pillar interconnects from the plurality of pillar interconnects 109 may include wall pillar interconnects.

The die substrate portion 102 includes a die substrate 120 and an active region 122. The die substrate 120 may include silicon (Si). The active region 122 may be formed in the die substrate 120 and/or a surface of the die substrate 120. The active region 122 may include a plurality of logic cells and/or a plurality of transistors. One or more transistors may define a logic cell. The plurality of logic cells may include functioning logic cells when the integrated device is in operation. The plurality of transistors may include functioning transistors. Different implementations may use different types of transistors, such as a field effect transistor (FET), planar FET, finFET, and a gate all around FET. In some implementations, a front end of line (FEOL) process may be used to fabricate the plurality of cells and/or transistors in and/or over the die substrate 120. In some implementations, the die substrate portion 102 may include a plurality of through substrate vias (not shown) that extend through the die substrate 120. A back side metallization portion (not shown) may be coupled to the die substrate 120. The back side metallization portion may include a plurality of back side metallization interconnects that are coupled to the through substrate vias that extend through the die substrate 120.

The die interconnection portion 104 is coupled to the die substrate portion 102. For example, the die interconnection portion 104 is coupled to the die substrate 120. The die interconnection portion 104 includes at least one dielectric layer 140 and a plurality of die interconnects 142. The die interconnection portion 104 may be configured to be electrically coupled to the active region 122. For example, the plurality of die interconnects 142 may be configured to be electrically coupled to the active region 122. Thus, the plurality of die interconnects 142 may be configured to be electrically coupled to the plurality of logic cells and/or plurality of transistors. In some implementations, a back end of line (BEOL) process may be used to fabricate the die interconnection portion 104. The die interconnection portion 104 may be a BEOL die interconnection portion. The plurality of die interconnects 142 may include copper (Cu). The die interconnection portion 104 may be formed over the die substrate portion 102.

The plurality of pad interconnects 103 are coupled to the die interconnection portion 104. The plurality of pad interconnects 103 may be coupled to the plurality of die interconnects 142. The plurality of pad interconnects 103 may include a pad interconnect 103*a* (e.g., first pad interconnect) and a pad interconnect 103*b* (e.g., second pad interconnect). The pad interconnect 103*a* may have a circular planar shape and/or an approximate circular planar shape. The pad interconnect 103*b* may have a circular planar shape and/or an approximate circular planar shape. The pad interconnect 103*a* may be located laterally to the pad interconnect 103*b*.

The passivation layer 106 is coupled to the die interconnection portion 104. The passivation layer 106 may be formed and coupled to a surface of the die interconnection portion 104. The passivation layer 106 may be coupled to and touch the at least one dielectric layer 140. The passivation layer 106 may be formed and coupled to part of the plurality of pad interconnects 103. In some implementations, the passivation layer 106 may include silicon nitride (SiN). However, different implementations may use different materials for the passivation layer 106. The passivation layer 106 may include a different material from the at least one dielectric layer 140.

The plurality of under bump metallization interconnects 107 may be formed and coupled to the plurality of pad interconnects 103. The plurality of under bump metallization interconnects 107 may include an under bump metallization interconnect 107*a* (e.g., first under bump metallization interconnect) and an under bump metallization interconnect 107*b* (e.g., second under bump metallization interconnect). The plurality of under bump metallization interconnects 107 may include copper (Cu). The plurality of under bump metallization interconnects 107 may include a seed layer. The under bump metallization interconnect 107*a* may be coupled to and touch the pad interconnect 103*a*. The under bump metallization interconnect 107*b* may be coupled to and touch the pad interconnect 103*b*. A portion of the plurality of under bump metallization interconnects 107 may be formed and/or located over the passivation layer 106. A portion of under bump metallization interconnect 107*a* may be formed and/or located over the passivation layer 106. A portion of the under bump metallization interconnect 107*b* may be formed and/or located over the passivation layer 106.

Figure 2:
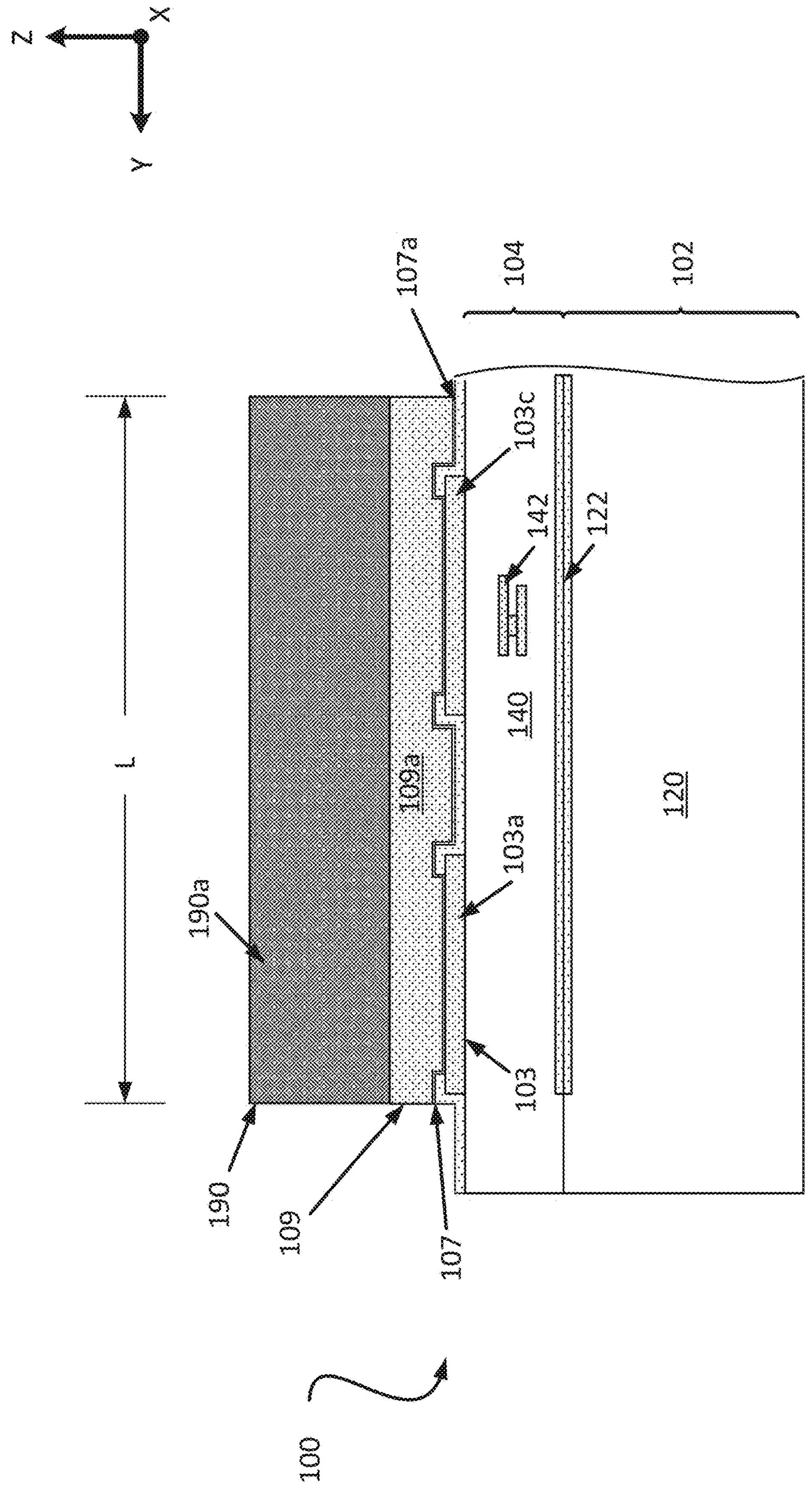
FIG. 2 illustrates a cross sectional profile view of an exemplary device that includes wall pillar interconnects.

The plurality of pillar interconnects 109 are coupled to the plurality of under bump metallization interconnects 107. The plurality of pillar interconnects 109 may include a plurality of wall pillar interconnects. The plurality of pillar interconnects 109 may be a plurality of bump pillar interconnects. The plurality of pillar interconnects 109 may include a plurality of wall bump pillar interconnects. The plurality of pillar interconnects 109 may include a pillar interconnect 109*a* (e.g., first pillar interconnect, first wall pillar interconnect) and a pillar interconnect 109*b* (e.g., second pillar interconnect, second wall pillar interconnect). In some implementations, a wall pillar interconnect may be a pillar interconnect comprising a length and a width, where the length of the pillar interconnect is greater than the width of the pillar interconnect. For example, in some implementations, a wall pillar interconnect may be a pillar interconnect comprising a length and a width, where the length of the pillar interconnect is at least 1.5 times greater than the width of the pillar interconnect. FIG. 1 illustrates an example of a width (W) for the pillar interconnect 109*a* (e.g., wall pillar interconnect, wall bump pillar interconnect). FIG. 2 illustrates an example of a length (L) for the pillar interconnect 109*a* (e.g., wall pillar interconnect, wall bump pillar interconnect).

Similarly, the plurality of under bump metallization interconnects 107 may include a plurality of wall under bump metallization interconnects. In some implementations, a wall under bump metallization interconnect may be an under bump metallization interconnect comprising a length and a width, where the length of the under bump metallization interconnect is greater than the width of the under bump metallization interconnect. For example, in some implementations, a wall under bump metallization interconnect may be an under bump metallization interconnect comprising a length and a width, where the length of the under bump metallization interconnect is at least 1.5 times greater than the width of the under bump metallization interconnect. FIG. 1 illustrates an example of a width (W) for the under bump metallization interconnect 107*a* (e.g., wall under bump metallization interconnect). FIG. 2 illustrates an example of a length (L) for the under bump metallization interconnect 107*a* (e.g., wall under bump metallization interconnect).

The plurality of solder interconnects 190 are coupled to the plurality of pillar interconnects 109. The plurality of solder interconnects 190 may include a solder interconnect 190*a* (e.g., first solder interconnect) and a solder interconnect 190*b* (e.g., second solder interconnect). The solder interconnect 190*a* may be coupled to the pillar interconnect 109*a*. The solder interconnect 190*b* may be coupled to the pillar interconnect 109*b*.

FIG. 2 illustrates the device 100 of FIG. 1 from a different perspective. As shown in FIG. 2, the plurality of pad interconnects 103 also includes a pad interconnect 103*c*. The pad interconnect 103*a* may be located laterally to the pad interconnect 103*c*. As further shown in FIG. 2, the under bump metallization interconnect 107*a* may be located over (i) the pad interconnect 103*a*, (ii) a portion of the passivation layer 106 and (iii) the pad interconnect 103*c*. For example, the under bump metallization interconnect 107*a* may be coupled to and touch (i) the pad interconnect 103*a*, (ii) a portion of the passivation layer 106 located between the pad interconnect 103*a* and the pad interconnect 103*c*, and (iii) the pad interconnect 103*c*. The under bump metallization interconnect 107*a* may vertically overlap with (i) the pad interconnect 103*a*, (ii) a portion of the passivation layer 106 and (iii) the pad interconnect 103*c*. The pad interconnect 103*a*, the pad interconnect 103*b* and the pad interconnect 103*c* are each separate pad interconnects.

The pillar interconnect 109*a* may be coupled to the under bump metallization interconnect 107*a*. The pillar interconnect 109*a* may vertically overlap with (i) the pad interconnect 103*a*, (ii) a portion of the passivation layer 106 and (iii) the pad interconnect 103*c*. The pillar interconnect 109*a* may be configured as a wall pillar interconnect. The under bump metallization interconnect 107*a* may be configured as a wall under bump metallization interconnect. In some implementations, a wall pillar interconnect may be a pillar interconnect that vertically overlaps with two or more pad interconnects. In some implementations, a wall pillar interconnect may be a pillar interconnect whose longest dimension in a first lateral direction is at least 1.5 times greater (e.g., longer) than the shortest dimension in a second lateral direction. In some implementations, an under bump metallization interconnect may be an under bump metallization interconnect that vertically overlaps with two or more pad interconnects. In some implementations, an under bump metallization interconnect may be an under bump metallization interconnect whose longest dimension in a first lateral direction is at least 1.5 times greater (e.g., longer) than the shortest dimension in a second lateral direction.

The solder interconnect 190*a* may be coupled the pillar interconnect 109*a*. The solder interconnect 190*a* may vertically overlap with the pad interconnect 103*a* and the pad interconnect 103*c*.

Figure 3:
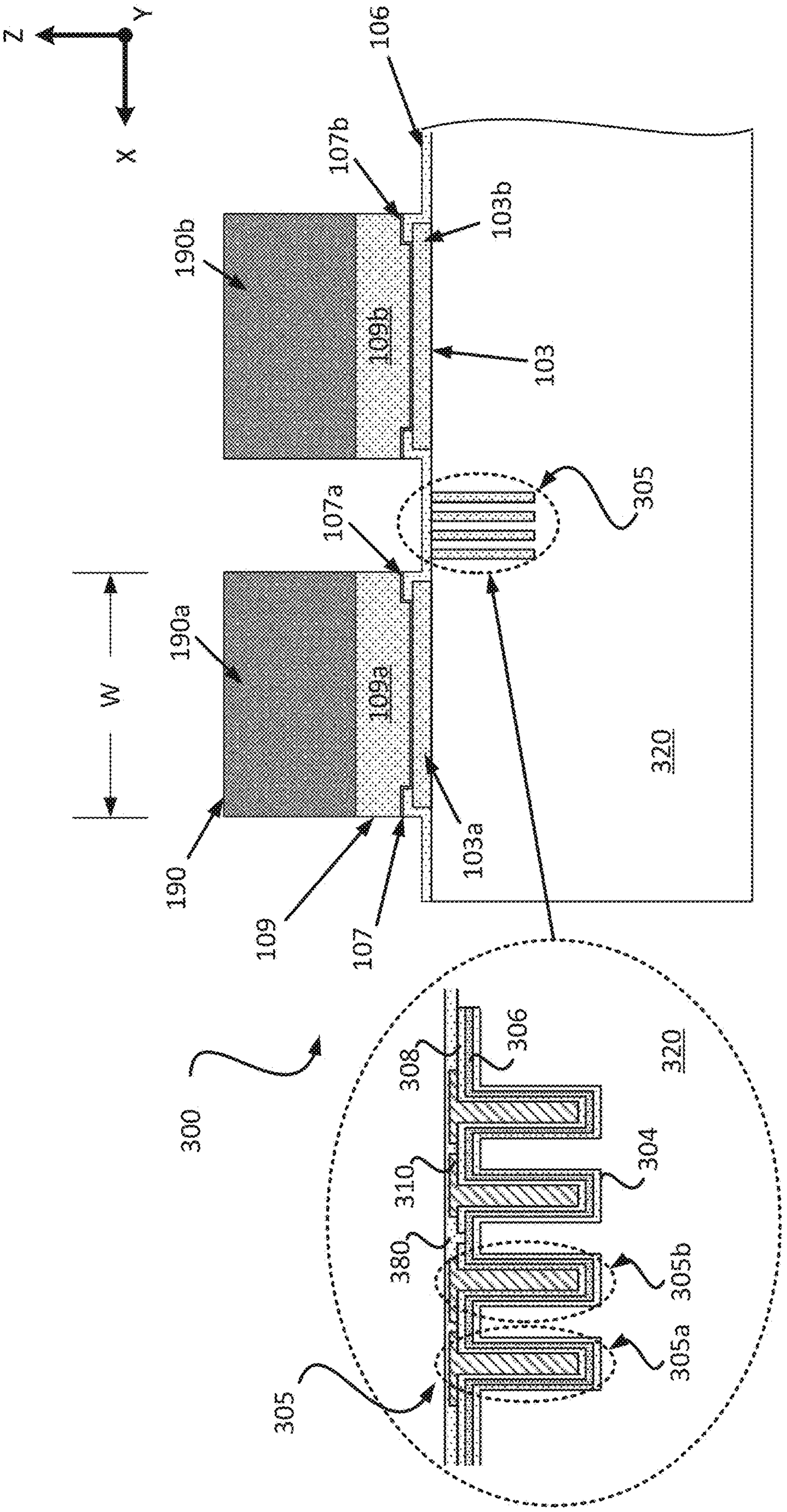
FIG. 3 illustrates a cross sectional profile view of an exemplary passive device that includes wall pillar interconnects.

FIG. 3 illustrates a cross sectional profile view of a passive device 300 that includes pillar interconnects, where at least some of the pillar interconnects are configured as wall pillar interconnects. The passive device 300 may include a plurality of trench capacitors (e.g., plurality of deep trench capacitors). The passive device 300 includes a die substrate 320, a plurality of trench capacitors 305, a plurality of pad interconnects 103, a plurality of under bump metallization interconnects 107, a plurality of pillar interconnects 109, a plurality of solder interconnects 190, and/or a passivation layer 106.

The die substrate 320 may include silicon (Si). The die substrate 320 may be a passive die substrate. The plurality of trench capacitors 305 may be formed and/or located at least partially in the die substrate 320. The plurality of trench capacitors 305 may be coupled to the plurality of pad interconnects 103. The die substrate 320 may include a plurality of trenches and/or cavities over which capacitors may be formed.

The passive device 300 may be an integrated passive device (e.g., silicon passive device) that includes multiple trench capacitors (e.g., deep trench capacitors). The passive device 300 may be a means for trench capacitance. The passive device 300 includes a front side and a back side. The front side of the passive device 300 may include the plurality of trench capacitors.

The plurality of trench capacitors 305 include a trench capacitor 305*a* and a trench capacitor 305*b*. The trench capacitor 305*a* and the trench capacitor 305*b* may be configured to be part of a same capacitor (e.g., first capacitor, first trench capacitor). The trench capacitor 305*a* and the trench capacitor 305*b* may be configured to be coupled to and/or part of a first power distribution network (PDN). The trench capacitor 305*a* and the trench capacitor 305*b* may be configured to be part of a first electrical path for a first power for a package. The trench capacitor 305*a* and the trench capacitor 305*b* may be configured to be coupled to integrated device(s). The plurality of trench capacitors 305 may be located at least partially in the die substrate 320.

As shown in FIG. 3, the passive device 300 includes the die substrate 320, an oxide layer 304, a first electrically conductive layer 306, a dielectric layer 308, a second electrically conductive layer 310, and a dielectric layer 380. The first electrically conductive layer 306 and/or the second electrically conductive layer 310 may include polysilicon. The oxide layer 304 and/or the dielectric layer 308 may include $SiO_2$ (e.g., low-pressure chemical vapor deposition (LPCVD) $SiO_2$) or $Si_3N_4$ (e.g., LPCVD $Si_3N_4$). Portions of the oxide layer 304, the first electrically conductive layer 306, the dielectric layer 308, and the second electrically conductive layer 310 may be located in trenches and/or cavities of the die substrate 320. It is noted that a die substrate 320 may be considered to have a trench or a cavity, even if the trench or the cavity is filled with one or more materials. The dielectric layer 380 may include silicon oxide and/or silicon nitride. The dielectric layer 380 may be formed over, coupled to and touch the plurality of trench capacitors 305. For example, the dielectric layer 380 may touch (i) portions of the first electrically conductive layer 306, (ii) portions of the dielectric layer 308, and/or (iii) portions of the second electrically conductive layer 310.

The trench capacitor 305*a* (e.g., first trench capacitor, first capacitor, means for first trench capacitance) may be defined by (i) a first portion of the oxide layer 304, (ii) a first portion of the first electrically conductive layer 306, (iii) a first portion of the dielectric layer 308, and (iv) a first portion of the second electrically conductive layer 310 that are located in a trench (e.g., first trench) of the die substrate 320.

The trench capacitor 305*b* (e.g., second trench capacitor, second capacitor, means for second trench capacitance) may be defined by (i) a second portion of the oxide layer 304, (ii) a second portion of the first electrically conductive layer 306, (iii) a second portion of the dielectric layer 308, and (iv) a second portion of the second electrically conductive layer 310 that are located in a trench (e.g., second trench) of the die substrate 320. It is noted that trench capacitor 305*b* may be part of a same capacitor as the trench capacitor 305*a*. That is, the trench capacitor 305*a* and the trench capacitor 305*b* may be configured to be electrically coupled together to form a capacitor (e.g., first capacitor) with a greater capacitance. The passive device 300 may include other interconnects that are coupled to the plurality of trench capacitors 305 and/or the plurality of pad interconnects 103. It should be noted that the structure of the plurality of trench capacitors 305 is exemplary. Other implementations of a trench capacitor may include other arrangements and/or configurations. Also, other implementations may use different materials for the trench capacitor.

The plurality of pad interconnects 103 are coupled to the die substrate 320. The plurality of pad interconnects 103 may be coupled (e.g., configured to be electrically coupled) to the plurality of trench capacitors 305. The plurality of pad interconnects 103 may include a pad interconnect 103*a* (e.g., first pad interconnect) and a pad interconnect 103*b* (e.g., second pad interconnect). The pad interconnect 103*a* may have a circular planar shape and/or an approximate circular planar shape. The pad interconnect 103*b* may have a circular planar shape and/or an approximate circular planar shape. The pad interconnect 103*a* may be located laterally to the pad interconnect 103*b*.

The passivation layer 106 is coupled to the die interconnection portion 104. The passivation layer 106 may be formed and coupled to a surface of the die interconnection portion 104. The passivation layer 106 may be coupled to and touch the at least one dielectric layer 140. The passivation layer 106 may be formed and coupled to part of the plurality of pad interconnects 103. In some implementations, the passivation layer 106 may include silicon nitride (SiN). However, different implementations may use different materials for the passivation layer 106. The passivation layer 106 may include a different material from the at least one dielectric layer 140.

The plurality of under bump metallization interconnects 107 may be formed and coupled to the plurality of pad interconnects 103. The plurality of under bump metallization interconnects 107 may include an under bump metallization interconnect 107*a* (e.g., first under bump metallization interconnect) and an under bump metallization interconnect 107*b* (e.g., second under bump metallization interconnect). The plurality of under bump metallization interconnects 107 may include copper (Cu). The plurality of under bump metallization interconnects 107 may include a seed layer. The under bump metallization interconnect 107*a* may be coupled to and touch the pad interconnect 103*a*. The under bump metallization interconnect 107*b* may be coupled to and touch the pad interconnect 103*b*. A portion of the plurality of under bump metallization interconnects 107 may be formed and/or located over the passivation layer 106. A portion of under bump metallization interconnect 107*a* may be formed and/or located over the passivation layer 106. A portion of the under bump metallization interconnect 107*b* may be formed and/or located over the passivation layer 106.

Figure 4:
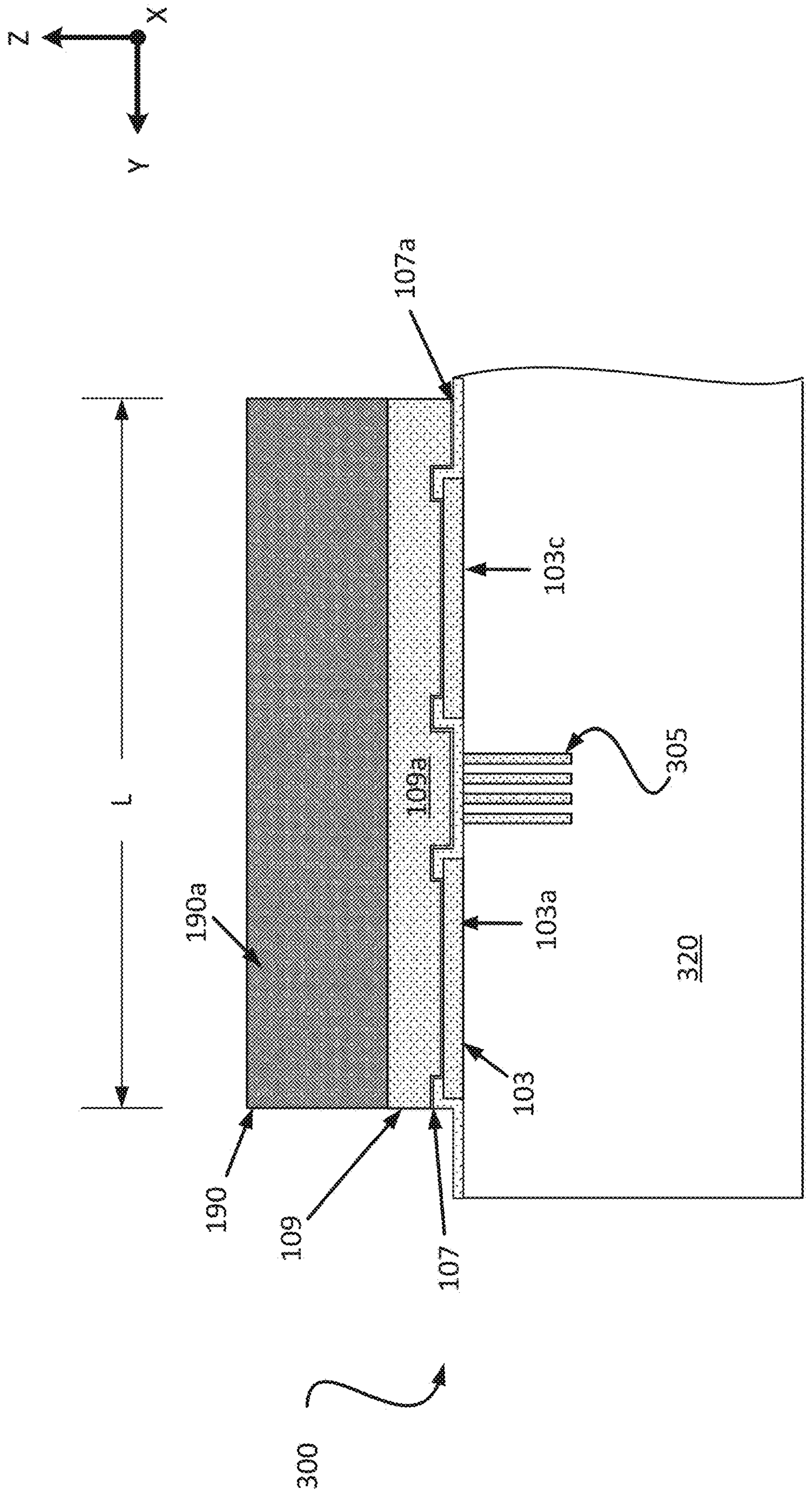
FIG. 4 illustrates a cross sectional profile view of an exemplary passive device that includes wall pillar interconnects.

The plurality of pillar interconnects 109 are coupled to the plurality of under bump metallization interconnects 107. The plurality of pillar interconnects 109 may include a plurality of wall pillar interconnects. The plurality of pillar interconnects 109 may include a pillar interconnect 109*a* (e.g., first pillar interconnect, first wall pillar interconnect) and a pillar interconnect 109*b* (e.g., second pillar interconnect, second wall pillar interconnect). In some implementations, a wall pillar interconnect may be a pillar interconnect comprising a length and a width, where the length of the pillar interconnect is greater than the width of the pillar interconnect. For example, in some implementations, a wall pillar interconnect may be a pillar interconnect comprising a length and a width, where the length of the pillar interconnect is at least 1.5 times greater than the width of the pillar interconnect. FIG. 3 illustrates an example of a width (W) for the pillar interconnect 109*a* (e.g., wall pillar interconnect). FIG. 4 illustrates an example of a length (L) for the pillar interconnect 109*a* (e.g., wall pillar interconnect).

Similarly, the plurality of under bump metallization interconnects 107 may include a plurality of wall under bump metallization interconnects. In some implementations, a wall under bump metallization interconnect may be an under bump metallization interconnect comprising a length and a width, where the length of the under bump metallization interconnect is greater than the width of the under bump metallization interconnect. For example, in some implementations, a wall under bump metallization interconnect may be an under bump metallization interconnect comprising a length and a width, where the length of the under bump metallization interconnect is at least 1.5 times greater than the width of the under bump metallization interconnect. FIG. 3 illustrates an example of a width (W) for the under bump metallization interconnect 107*a* (e.g., wall under bump metallization interconnect). FIG. 4 illustrates an example of a length (L) for the under bump metallization interconnect 107*a* (e.g., wall under bump metallization interconnect).

The plurality of solder interconnects 190 are coupled to the plurality of pillar interconnects 109. The plurality of solder interconnects 190 may include a solder interconnect 190*a* (e.g., first solder interconnect) and a solder interconnect 190*b* (e.g., second solder interconnect). The solder interconnect 190*a* may be coupled to the pillar interconnect 109*a*. The solder interconnect 190*b* may be coupled to the pillar interconnect 109*b*.

FIG. 4 illustrates the passive device 300 of FIG. 3 from a different perspective. As shown in FIG. 4, the plurality of pad interconnects 103 also includes a pad interconnect 103*c*. The pad interconnect 103*a* may be located laterally to the pad interconnect 103*c*. The plurality of solder interconnects 190 also includes a solder interconnect 190*c*. As further shown in FIG. 4, the under bump metallization interconnect 107*a* may be located over (i) the pad interconnect 103*a*, (ii) a portion of the passivation layer 106 and (iii) the pad interconnect 103*c*. For example, the under bump metallization interconnect 107*a* may be coupled to and touch (i) the pad interconnect 103*a*, (ii) a portion of the passivation layer 106 located between the pad interconnect 103*a* and the pad interconnect 103*c*, and (iii) the pad interconnect 103*c*. The under bump metallization interconnect 107*a* may vertically overlap with (i) the pad interconnect 103*a*, (ii) a portion of the passivation layer 106 and (iii) the pad interconnect 103*c*.

The pillar interconnect 109*a* may be coupled to the under bump metallization interconnect 107*a*. The pillar interconnect 109*a* may vertically overlap with (i) the pad interconnect 103*a*, (ii) a portion of the passivation layer 106 and (iii) the pad interconnect 103*c*. The pillar interconnect 109*a* may be configured as a wall pillar interconnect. The under bump metallization interconnect 107*a* may be configured as a wall under bump metallization interconnect. In some implementations, a wall pillar interconnect may be a pillar interconnect that vertically overlaps with two or more pad interconnects. In some implementations, a wall pillar interconnect may be a pillar interconnect whose longest dimension in a first lateral direction is at least 1.5 times greater (e.g., longer) than the shortest dimension in a second lateral direction. In some implementations, an under bump metallization interconnect may be an under bump metallization interconnect that vertically overlaps with two or more pad interconnects. In some implementations, an under bump metallization interconnect may be an under bump metallization interconnect whose longest dimension in a first lateral direction is at least 1.5 times greater (e.g., longer) than the shortest dimension in a second lateral direction.

The solder interconnect 190*a* may be coupled the pillar interconnect 109*a*. The solder interconnect 190*a* may vertically overlap with the pad interconnect 103*a* and the pad interconnect 103*c*. The solder interconnect 190*a* may vertically overlap with the pad interconnect 103*a* and the pad interconnect 103*c*.

The plurality of pillar interconnects 109 may be configured to provide one or more electrical paths for power, ground, and/or signals. In some implementations, a first plurality of pillar interconnects from the plurality of pillar interconnects 109 may be configured to provide one or more electrical paths for power. In some implementations, a second plurality of pillar interconnects from the plurality of pillar interconnects 109 may be configured to provide one or more electrical paths for ground. In some implementations, a third plurality of pillar interconnects from the plurality of pillar interconnects 109 may be configured to provide one or more electrical paths for one or more signals. In some implementations, (i) a first plurality of pillar interconnects from the plurality of pillar interconnects 109 may be configured to provide one or more electrical paths for a first power, (ii) a second plurality of pillar interconnects from the plurality of pillar interconnects 109 may be configured to provide one or more electrical paths for a second power, and (iii) a third plurality of pillar interconnects from the plurality of pillar interconnects 109 may be configured to provide one or more electrical paths for ground.

Figure 5:
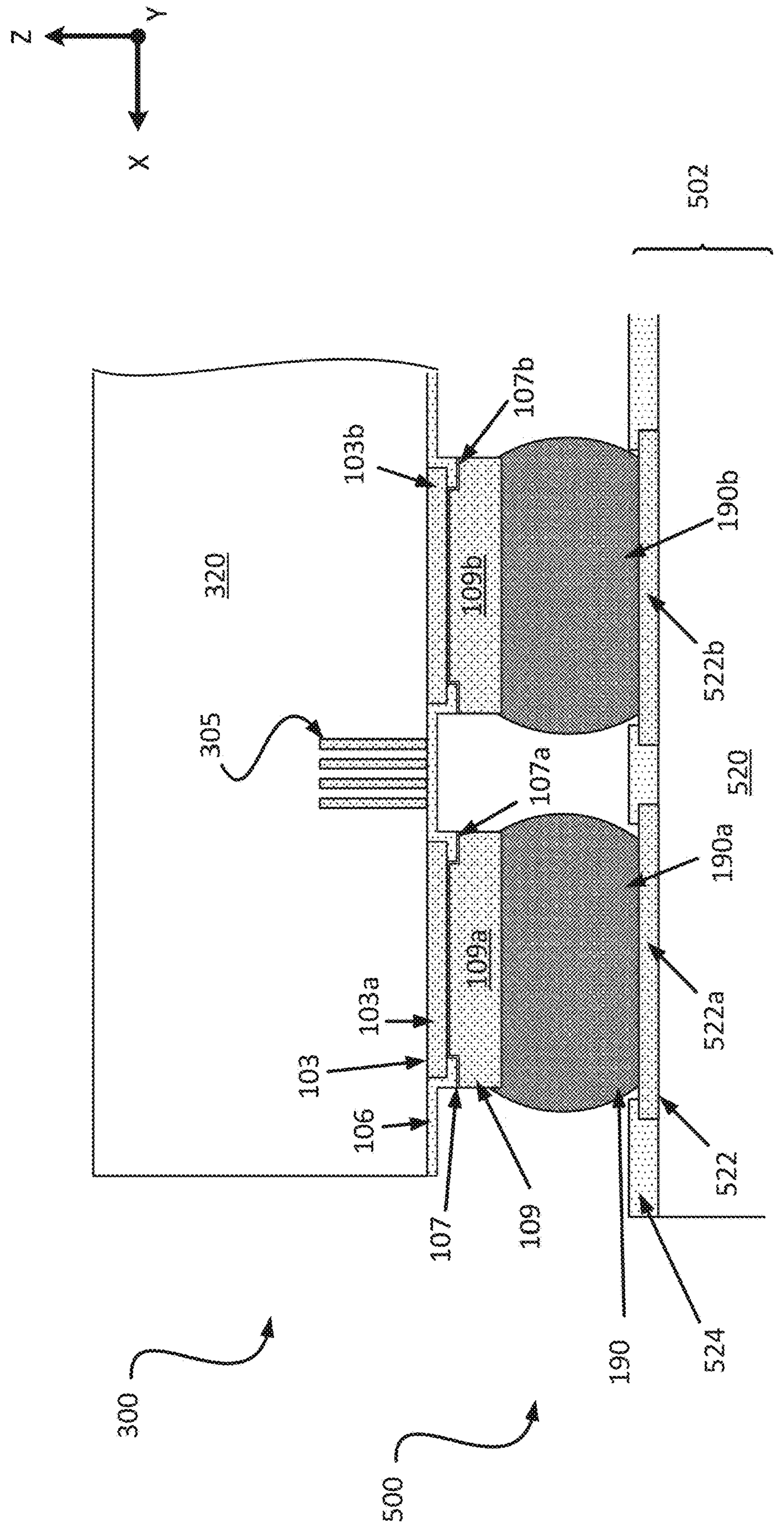
FIG. 5 illustrates a cross sectional profile view of an exemplary package comprising a passive device that includes wall pillar interconnects.

FIG. 5 illustrates a package 500 that includes a substrate 502 and a passive device 300 comprising wall pillar interconnects. The substrate 502 includes at least one dielectric layer 520, a plurality of interconnects 522 and a solder resist layer 524. The plurality of interconnects 522 may include an interconnect 522*a* and an interconnect 522*b*. The passive device 300 is coupled to the substrate 502 through the plurality of pillar interconnects 109 and the plurality of solder interconnects 190. For example, the pillar interconnect 109*a* may be coupled to the interconnect 522*a* through the solder interconnect 190*a*. The interconnect 522*a* may include a pad interconnect. The pillar interconnect 109*b* is coupled to the interconnect 522*b* through the solder interconnect 190*b*.

Figure 6:
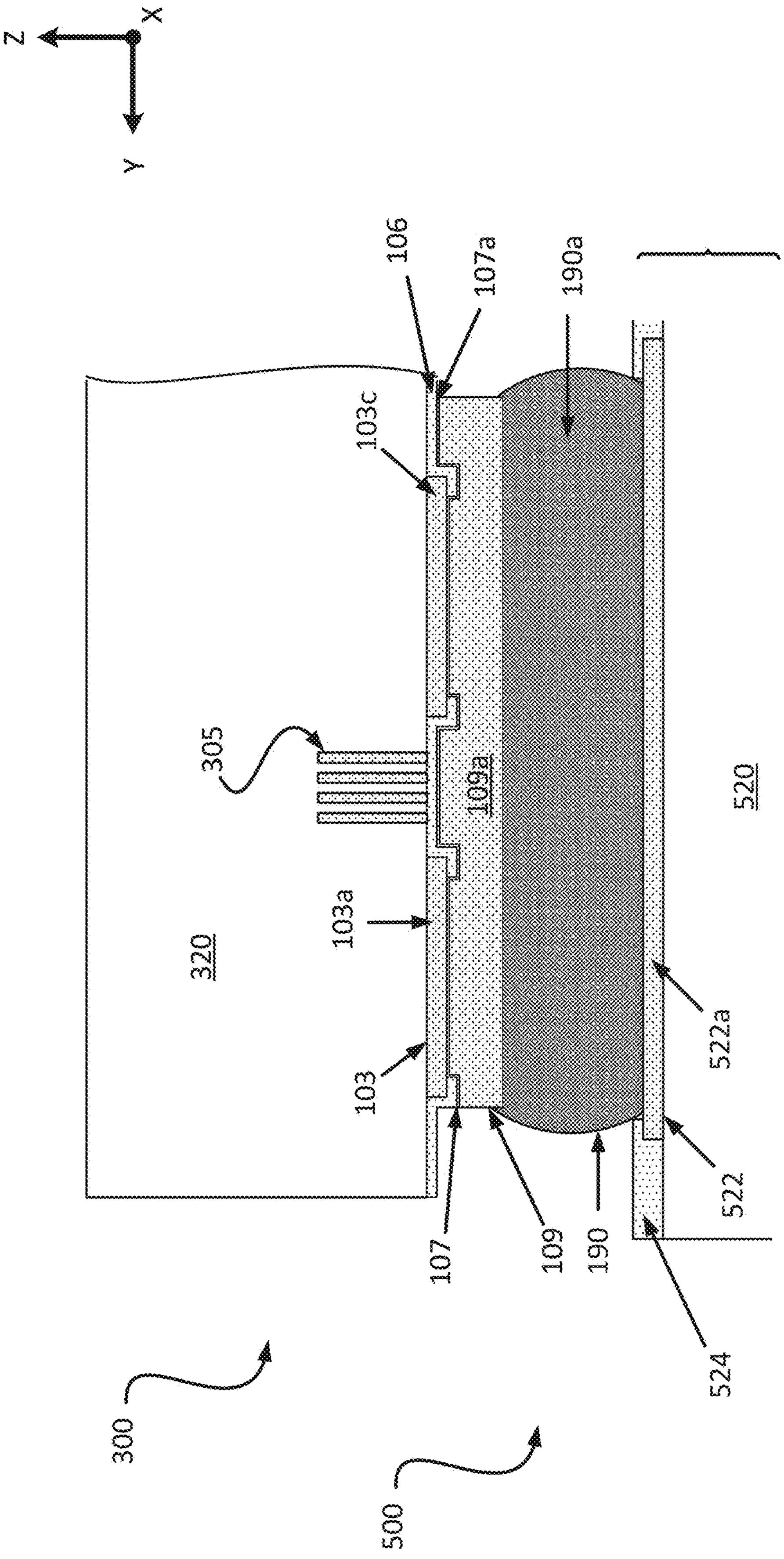
FIG. 6 illustrates a cross sectional profile view of an exemplary package comprising a passive device that includes wall pillar interconnects.

FIG. 6 illustrates the package 500 of FIG. 6 from a different perspective. As shown in FIG. 6, the plurality of interconnects 522 include the interconnect 522*a* and the plurality of solder interconnects 190 include the solder interconnect 190*a*. The interconnect 522*a* may include a pad interconnect. The pillar interconnect 109*a* may be coupled to the interconnect 522*a* through the solder interconnect 190*a*. The solder interconnect 190*a* may vertically overlap with the interconnect 522*a*, the pad interconnect 103*a* and the pad interconnect 103*c*.

As mentioned above, the pillar interconnect 109*a* may be configured as a wall pillar interconnect and/or the under bump metallization interconnect 107*a* may be configured as a wall under bump metallization interconnect. The use of one or more wall pillar interconnects and/or one or more wall under bump metallization interconnects may help provide improved mechanical coupling between the passive device 300 and the substrate 502. This may negate the need for a underfill between the passive device 300 and the substrate 502. Thus, the package 500 may be free of an underfill in a region located vertically between the passive device 300 and the substrate 502. The same advantage may be applicable to the device 100 and a substrate. Thus, for an example, an integrated device may include wall pillar interconnects, and the integrated device may be coupled to a substrate (e.g., 502) in a similar manner as described in FIGS. 5-6.

FIGS. 7-11 illustrate examples of how pillar interconnects, under bump metallization interconnects and/or solder interconnects may be arranged and/or configured in a device and/or a passive device. The pillar interconnects, the under bump metallization interconnects and/or solder interconnects that are illustrated and described in FIGS. 7-11 may represent examples of configurations and/or arrangements of the pillar interconnects, the under bump metallization interconnects and/or solder interconnects of any of the devices and/or passive devices of the disclosure.

Figure 7:
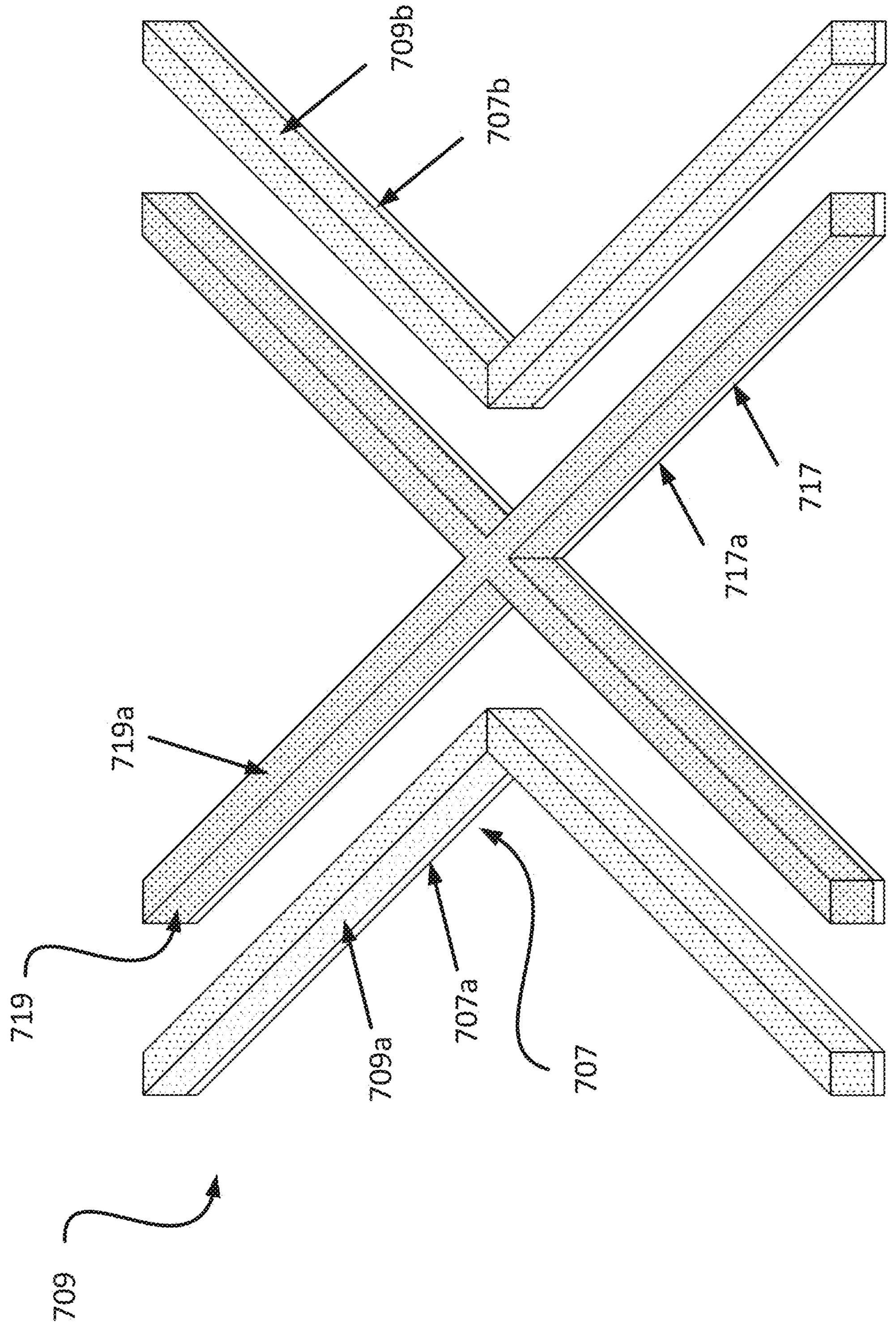
FIG. 7 illustrates a view of an example of a configuration of wall pillar interconnects.

FIG. 7 illustrates an exemplary angled view of solder interconnects, wall pillar interconnects and/or wall under bump metallization interconnects that may be implemented as part of a device. In particular, FIG. 7 illustrate a plurality of interconnects 707, a plurality of interconnects 717, a plurality of solder interconnects 709 and a plurality of solder interconnects 719. The plurality of interconnects 707 may represent (i) a plurality of pillar interconnects or (ii) a plurality of under bump metallization interconnects and a plurality of pillar interconnects. The plurality of interconnects 707 may be configured as a plurality of wall interconnects. The plurality of interconnects 717 may represent (i) a plurality of pillar interconnects or (ii) a plurality of under bump metallization interconnects and a plurality of pillar interconnects. The plurality of interconnects 717 may be configured as a plurality of wall interconnects. The plurality of solder interconnects 709 may be configure as a plurality of wall solder interconnects. The plurality of solder interconnects 719 may be configure as a plurality of wall solder interconnects.

The plurality of interconnects 707 include an interconnect 707*a* and an interconnect 707*b*. The plurality of interconnects 717 include an interconnect 717*a*. The plurality of solder interconnects 709 include a solder interconnect 709*a* and a solder interconnect 709*b*. The plurality of solder interconnects 719 include a solder interconnect 719*a*.

The solder interconnect 709*a* is coupled to the interconnect 707*a*. The solder interconnect 709*a* and the interconnect 707*a* may extend in one or more diagonal directions along a plane of the device (e.g., diagonal direction relative to an edge of a passive device and/or an edge of a device). For example, a first portion of the solder interconnect 709*a* and the interconnect 707*a* may extend along a first diagonal direction, and a second portion of the solder interconnect 709*a* and the interconnect 707*a* may extend along a second diagonal direction.

The solder interconnect 709*b* is coupled to the interconnect 707*b*. The solder interconnect 709*b* and the interconnect 707*b* may extend in one or more diagonal directions along a plane of the device (e.g., diagonal direction relative to an edge of a passive device and/or an edge of a device). For example, a first portion of the solder interconnect 709*b* and the interconnect 707*b* may extend along a first diagonal direction, and a second portion of the solder interconnect 709*b* and the interconnect 707*b* may extend along a second diagonal direction.

The solder interconnect 719*a* is coupled to the interconnect 717*a*. The solder interconnect 719*a* and the interconnect 717*a* may extend in one or more diagonal directions along a plane of the device (e.g., diagonal direction relative to an edge of a passive device and/or an edge of a device). For example, a first portion of the solder interconnect 719*a* and the interconnect 717*a* may extend along a first diagonal direction, and a second portion of the solder interconnect 719*a* and the interconnect 717*a* may extend along a second diagonal direction. In some implementations, the solder interconnect 719*a* and/or the interconnect 717*a* may have a planar cross section (e.g., along X-Y plane) in the shape of an X.

In some implementations, the plurality of solder interconnects 719 may be configured to provide one or more electrical paths for ground and/or Vss. In some implementations, the plurality of solder interconnects 709 may be configured to provide one or more electrical paths for power and/or Vdd.

Figure 8:
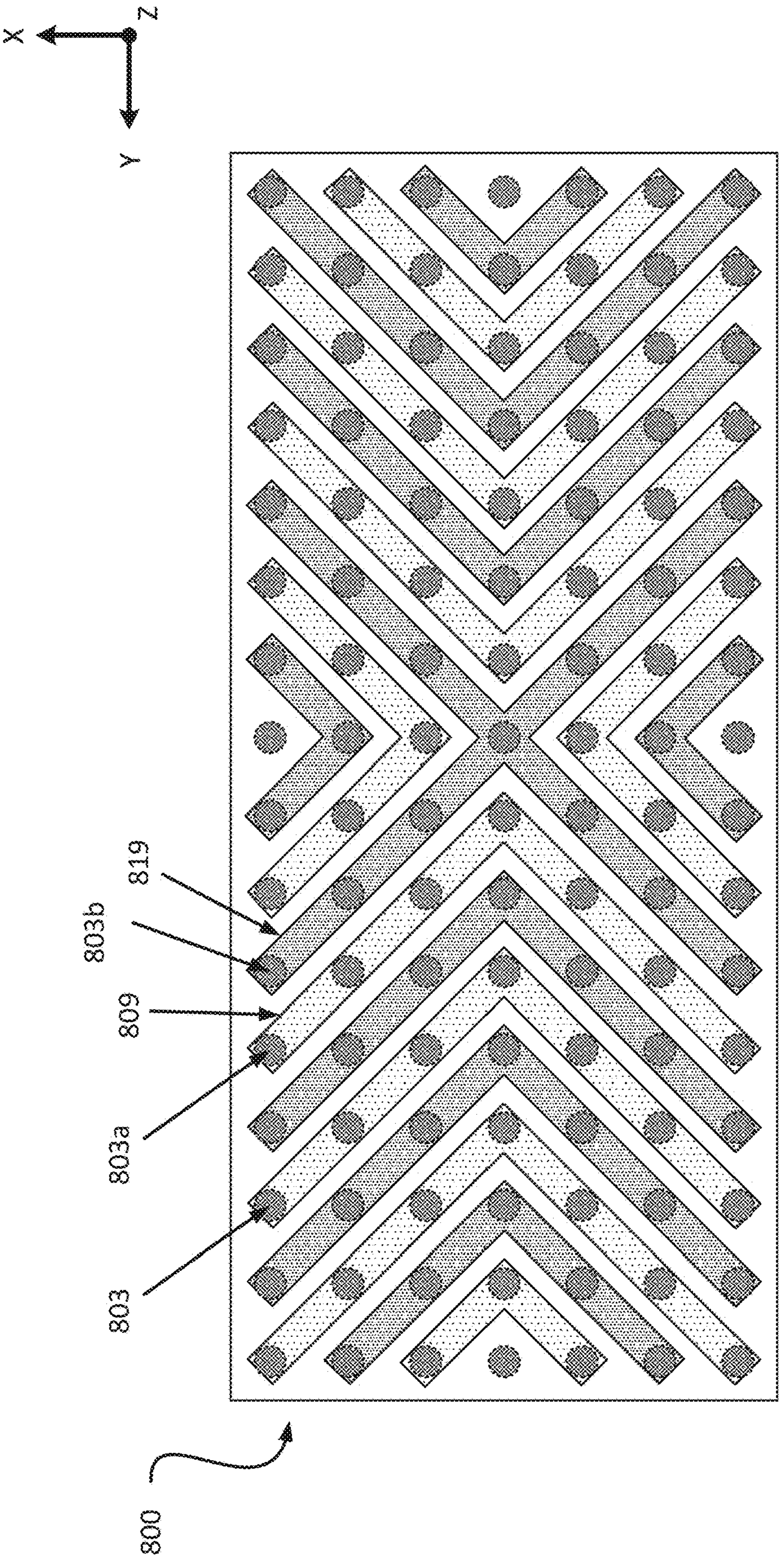
FIG. 8 illustrates a plan view of an example of a configuration of wall pillar interconnects.

FIG. 8 illustrates an exemplary plan view of a device 800 that includes wall pillar interconnects. The device 800 may represent the device 100 and/or the passive device 300. The device 800 includes a plurality of pillar interconnects 809, a plurality of pillar interconnects 819 and a plurality of pad interconnects 803. The plurality of pad interconnects 803 may represent the plurality of pad interconnects 103. The plurality of pillar interconnects 809 may be configured as a plurality of wall pillar interconnects. The plurality of pillar interconnects 819 may be configured as a plurality of wall pillar interconnects. The plurality of pad interconnects 803 may include a first plurality of pad interconnects 803*a* and a second plurality of pad interconnects 803*b*. The first plurality of pad interconnects 803*a* may be coupled (directly or indirectly) to the plurality of pillar interconnects 809. The plurality of pillar interconnects 809 may vertically overlap with the first plurality of pad interconnects 803*a*. The second plurality of pad interconnects 803*b* may be coupled (directly or indirectly) to the plurality of pillar interconnects 819. The plurality of pillar interconnects 819 may vertically overlap with the first plurality of pad interconnects 803*b*. The plurality of pillar interconnects 809 and the plurality of pillar interconnects 819 may extend in one or more diagonal directions along a plane of the device (e.g., diagonal direction relative to an edge of a passive device and/or an edge of a device). FIG. 8 illustrates that at least one pillar interconnect from the plurality of pillar interconnects 809 vertically overlaps with two or more pad interconnects from the first plurality of pad interconnects 803*a*. FIG. 8 also illustrates that at least one pillar interconnect from the plurality of pillar interconnects 819 vertically overlaps with two or more pad interconnects from the second plurality of pad interconnects 803*b*.

Figure 9:
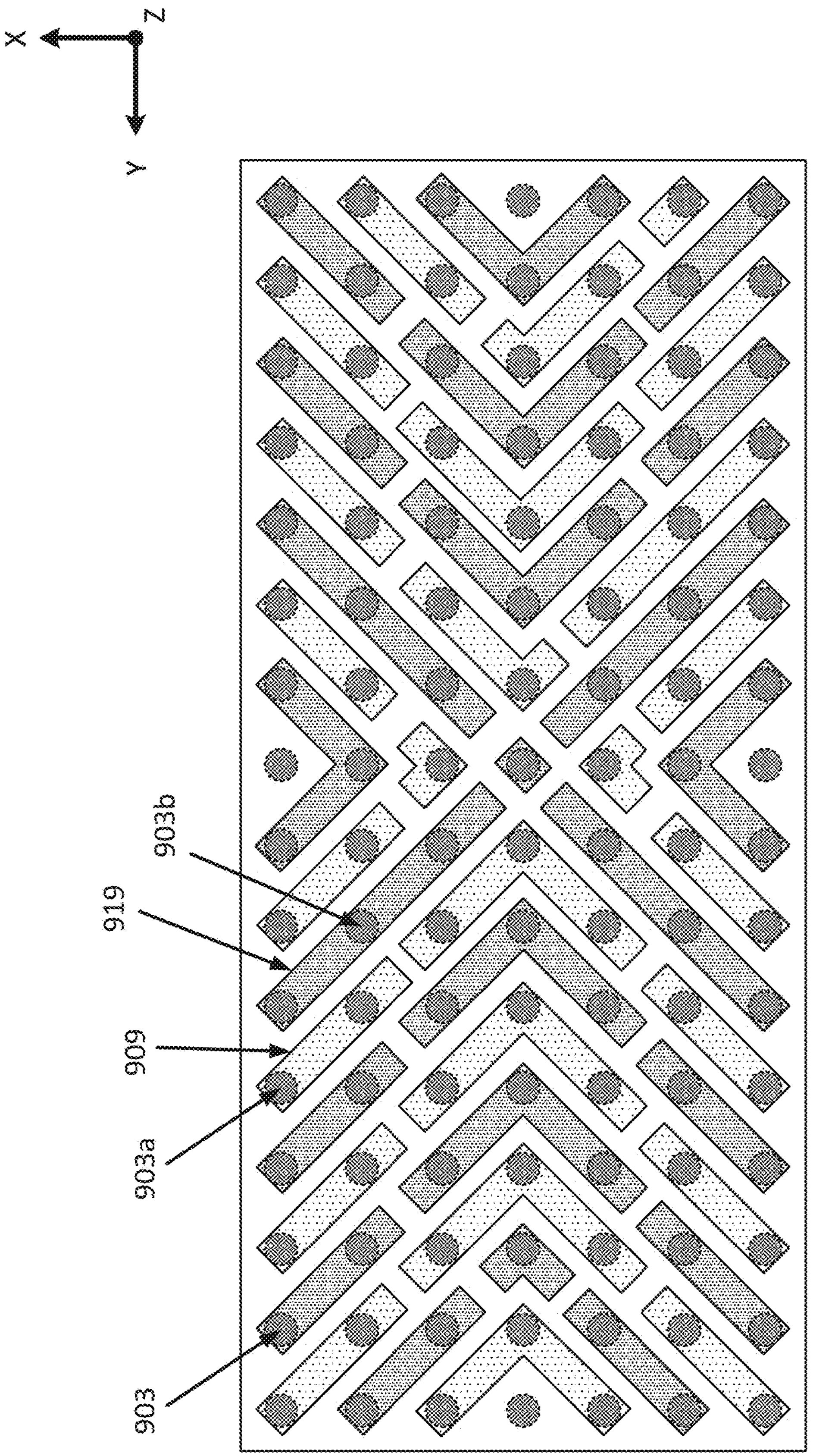
FIG. 9 illustrates a plan view of an example of a configuration of wall pillar interconnects.

FIG. 9 illustrates an exemplary plan view of a device 900 that includes segmented wall pillar interconnects. The device 900 may represent the device 100 and/or the passive device 300. The device 900 includes a plurality of pillar interconnects 909, a plurality of pillar interconnects 919 and a plurality of pad interconnects 903. The plurality of pad interconnects 903 may represent the plurality of pad interconnects 103. The plurality of pillar interconnects 909 may be configured as a plurality of segmented wall pillar interconnects. The plurality of pillar interconnects 919 may be configured as a plurality of segmented wall pillar interconnects. A segmented wall pillar interconnect may be two or more pillar interconnects that are configured to operate as a wall interconnect. A segmented wall pillar interconnect may have an effective length (L) and a width (W), where the effective length is at least 1.5 times greater (e.g., longer) than the width. An effective length may be the sum of the length of two or more (e.g., all the pillar interconnects) adjacent pillar interconnects that are part of the segmented wall pillar interconnect. The plurality of pad interconnects 903 may include a first plurality of pad interconnects 903*a* and a second plurality of pad interconnects 903*b*. The plurality of pad interconnects 903*a* may be coupled (directly or indirectly) to the plurality of pillar interconnects 909. The plurality of pad interconnects 903*b* may be coupled (directly or indirectly) to the plurality of pillar interconnects 919.

The plurality of pillar interconnects 909 and the plurality of pillar interconnects 919 may extend in one or more diagonal directions along a plane of the device (e.g., diagonal direction relative to an edge of a passive device and/or an edge of a device). The plurality of pillar interconnects 909 may be configure as a plurality of wall pillar interconnects. The plurality of pillar interconnects 919 may be configure as a plurality of wall pillar interconnects.

FIG. 9 illustrates that at least one pillar interconnect from the plurality of pillar interconnects 909 vertically overlaps with two or more pad interconnects from the first plurality of pad interconnects 903*a*. FIG. 9 also illustrates that at least one pillar interconnect from the plurality of pillar interconnects 919 vertically overlaps with two or more pad interconnects from the second plurality of pad interconnects 903*b*.

Figure 10:
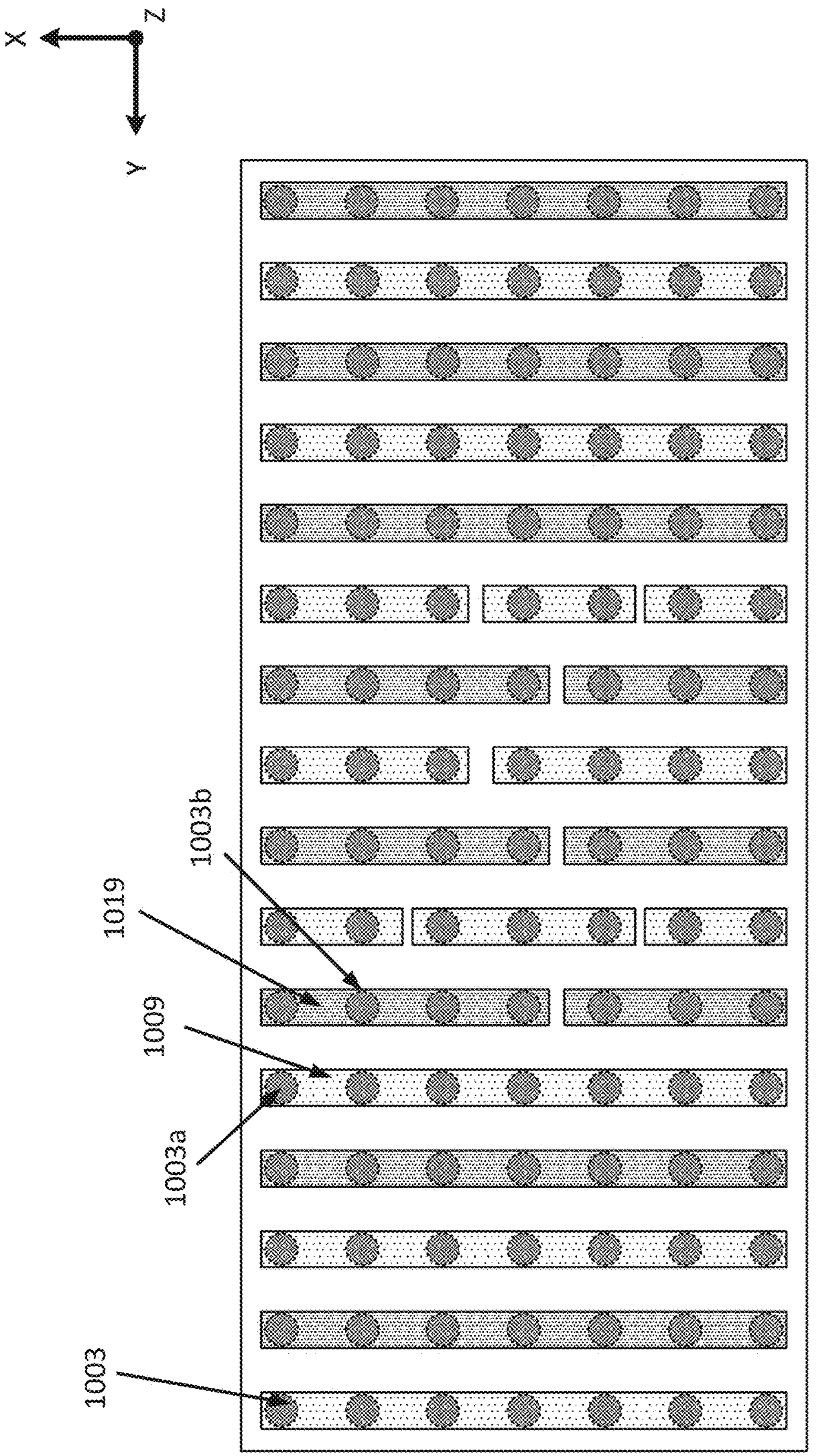
FIG. 10 illustrates a plan view of an example of a configuration of wall pillar interconnects.

FIG. 10 illustrates an exemplary plan view of a device 1000 that includes wall pillar interconnects. The device 1000 may represent the device 100 and/or the passive device 300. The device 1000 includes a plurality of pillar interconnects 1009, a plurality of pillar interconnects 1019 and a plurality of pad interconnects 1003. The plurality of pad interconnects 1003 may represent the plurality of pad interconnects 103. The plurality of pillar interconnects 1009 may include pillar interconnects that are configured as a plurality of segmented wall pillar interconnects. The plurality of pillar interconnects 1019 may include pillar interconnects that are configured as a plurality of segmented wall pillar interconnects. Some of the pillar interconnects may be wall pillar interconnects and/or segmented wall pillar interconnects. A segmented wall pillar interconnect may be two or more adjacent pillar interconnects that are configured to operate as a wall interconnect. A segmented wall pillar interconnect may have an effective length (L) and a width (W), where the effective length is at least 1.5 times greater (e.g., longer) than the width. An effective length may be the sum of the length of two or more (e.g., all the pillar interconnects) adjacent pillar interconnects that are part of the segmented wall pillar interconnect. The plurality of pad interconnects 1003 may include a first plurality of pad interconnects 1003*a* and a second plurality of pad interconnects 1003*b*. The plurality of pad interconnects 1003*a* may be coupled (directly or indirectly) to the plurality of pillar interconnects 1009. The plurality of pad interconnects 1003*a* may vertically overlap with the plurality of pillar interconnects 1009. The plurality of pad interconnects 1003*b* may be coupled (directly or indirectly) to the plurality of pillar interconnects 1019. The plurality of pad interconnects 1003*b* may vertically overlap with the plurality of pillar interconnects 1019.

The plurality of pillar interconnects 1009 and the plurality of pillar interconnects 1019 may extend in one or more non-diagonal directions along a plane of the device (e.g., non-diagonal direction relative to an edge of a passive device and/or an edge of a device). The plurality of pillar interconnects 1009 may be configure as a plurality of wall pillar interconnects. The plurality of pillar interconnects 1019 may be configure as a plurality of wall pillar interconnects.

Figure 11:
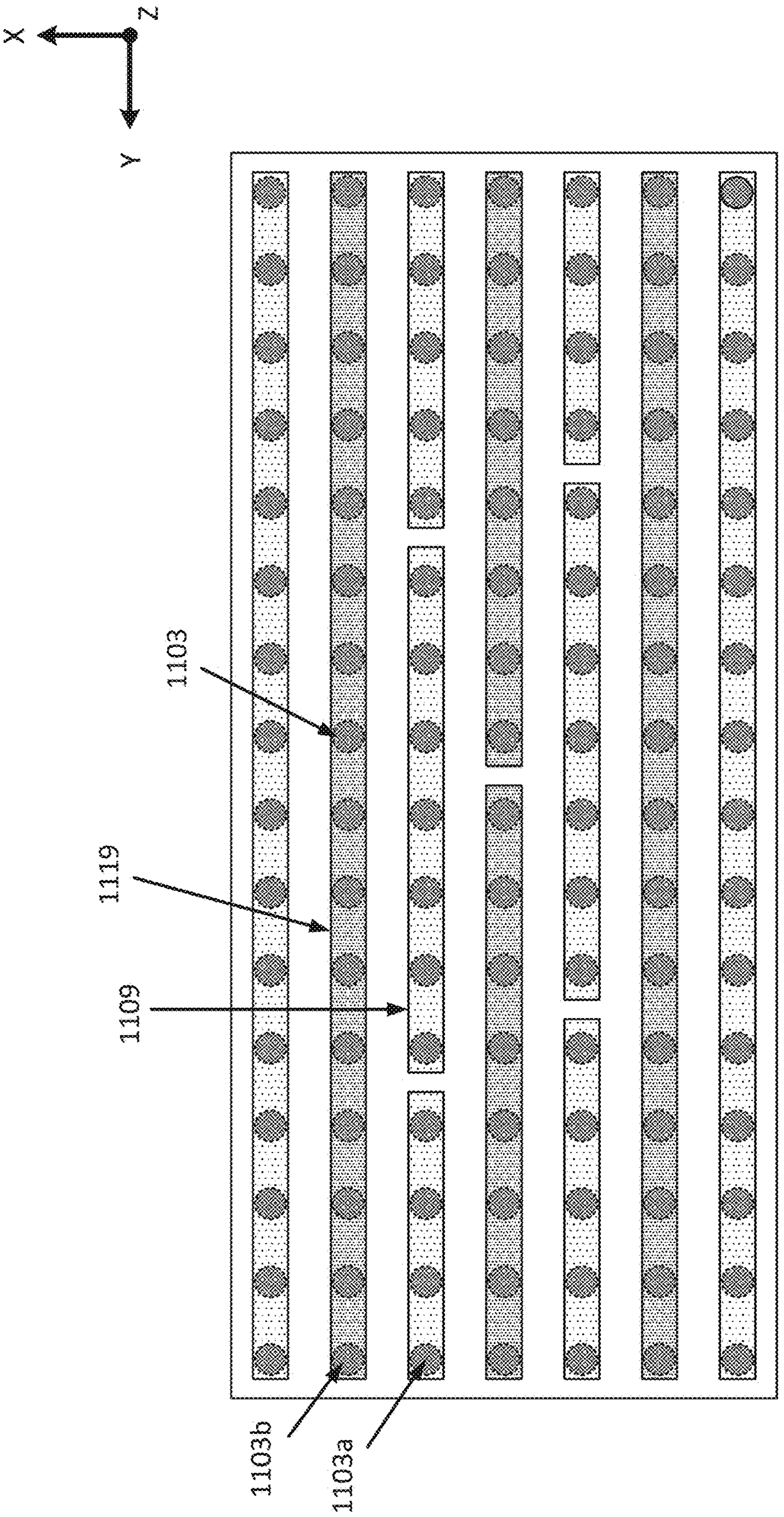
FIG. 11 illustrates a plan view of an example of a configuration of wall pillar interconnects.

FIG. 11 illustrates an exemplary plan view of a device 1100 that includes wall pillar interconnects. The device 1100 may represent the device 110 and/or the passive device 300. The device 1100 includes a plurality of pillar interconnects 1109, a plurality of pillar interconnects 1119 and a plurality of pad interconnects 1103. The plurality of pad interconnects 1103 may represent the plurality of pad interconnects 103. The plurality of pillar interconnects 1109 may include pillar interconnects that are configured as a plurality of segmented wall pillar interconnects. The plurality of pillar interconnects 1119 may include pillar interconnects that are configured as a plurality of segmented wall pillar interconnects. Some of the pillar interconnects may be wall pillar interconnects and/or segmented wall pillar interconnects. A segmented wall pillar interconnect may be two or more adjacent pillar interconnects that are configured to operate as a wall interconnect. A segmented wall pillar interconnect may have an effective length (L) and a width (W), where the effective length is at least 1.5 times greater (e.g., longer) than the width. An effective length may be the sum of the length of two or more (e.g., all the pillar interconnects) adjacent pillar interconnects that are part of the segmented wall pillar interconnect. The plurality of pad interconnects 1103 may include a first plurality of pad interconnects 1103*a* and a second plurality of pad interconnects 1103*b*. The plurality of pad interconnects 1103*a* may be coupled (directly or indirectly) to the plurality of pillar interconnects 1109. The plurality of pad interconnects 1103*a* may vertically overlap with the plurality of pillar interconnects 1109. The plurality of pad interconnects 1103*b* may be coupled (directly or indirectly) to the plurality of pillar interconnects 1119. The plurality of pad interconnects 1103*b* may vertically overlap with the plurality of pillar interconnects 1119.

The plurality of pillar interconnects 1109 and the plurality of pillar interconnects 1119 may extend in one or more non-diagonal directions along a plane of the device (e.g., non-diagonal direction relative to an edge of a passive device and/or an edge of a device). The plurality of pillar interconnects 1109 may be configure as a plurality of wall pillar interconnects. The plurality of pillar interconnects 1119 may be configure as a plurality of wall pillar interconnects.

FIGS. 7-11 illustrate examples of how pillar interconnects, under bump metallization interconnects and/or solder interconnects may be arranged and/or configured in a device and/or a passive device. In some implementations, a device and/or passive device may include combinations of the arrangements shown in FIGS. 7-11. In some implementations, pillar interconnects, under bump metallization interconnects and/or solder interconnects may form an enclosure.

An integrated device (e.g., 100) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device may include at least one electronic circuit (e.g., first electronic circuit, second electronic circuit, etc. . . . ). An integrated device may include an input/output (I/O) hub. An integrated device may include transistors. An integrated device may be an example of an electrical component and/or electrical device.

In some implementations, an integrated device may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). As mentioned above, using several chiplets that perform several functions may reduce the overall cost of a package relative to using a single chip to perform all of the functions of a package. In some implementations, one or more of the chiplets and/or one of more of integrated devices (e.g., 100) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, a first integrated device and a second integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advanced technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

The package (e.g., 500) may be implemented in a radio frequency (RF) package. The RF package may be a radio frequency front end (RFFE) package. A package (e.g., 500) may be configured to provide Wireless Fidelity (WiFi) communication and/or cellular communication (e.g., 2G, 3G, 4G, 5G). The packages (e.g., 100, 600) may be configured to support Global System for Mobile (GSM) Communications, Universal Mobile Telecommunications System (UMTS), and/or Long-Term Evolution (LTE). The packages (e.g., 500) may be configured to transmit and receive signals having different frequencies and/or communication protocols.

Exemplary Sequence for Fabricating a Passive Device

Figure 12A:
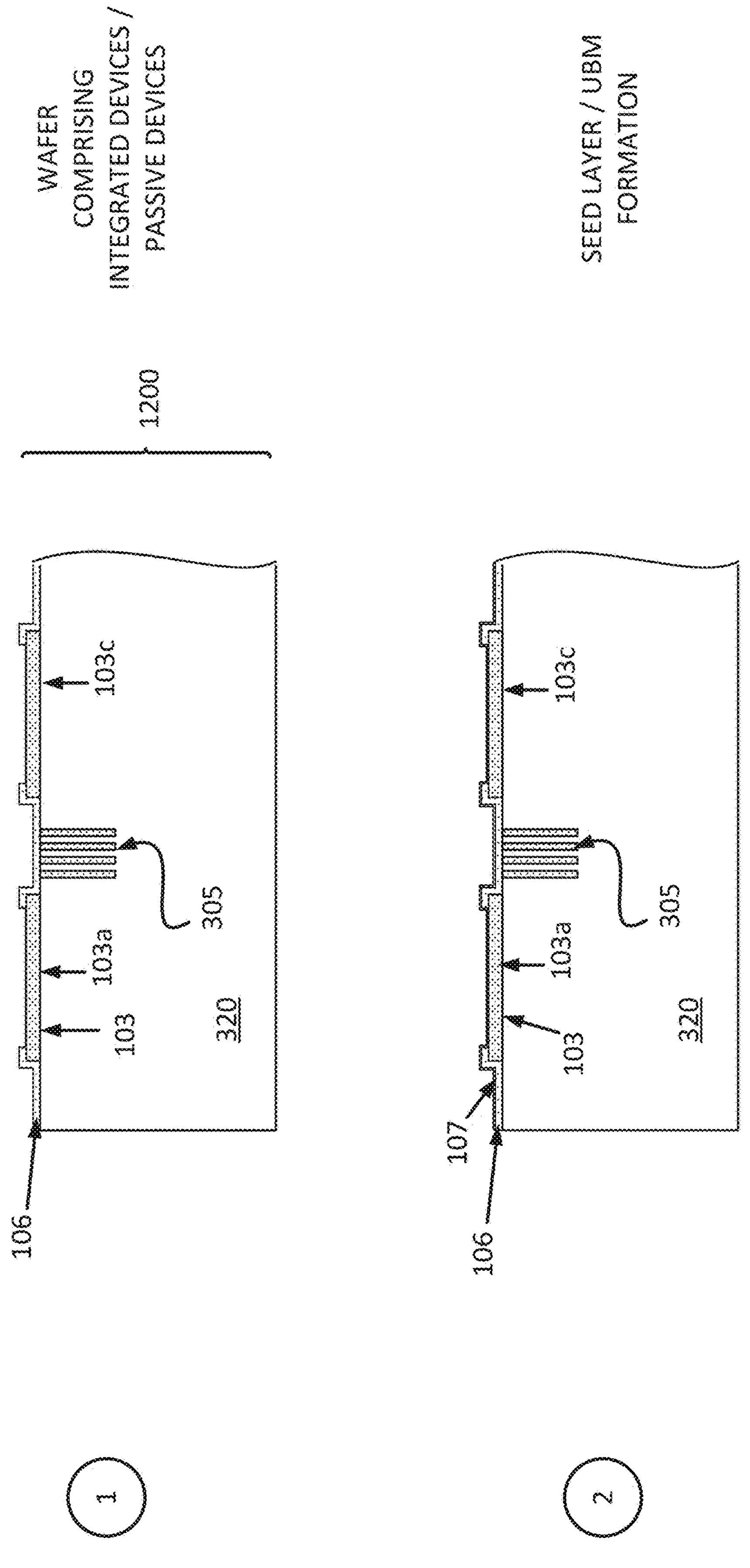
FIGS. 12A-12C illustrate an exemplary sequence for fabricating a passive device that includes wall pillar interconnects.
Figure 12B:
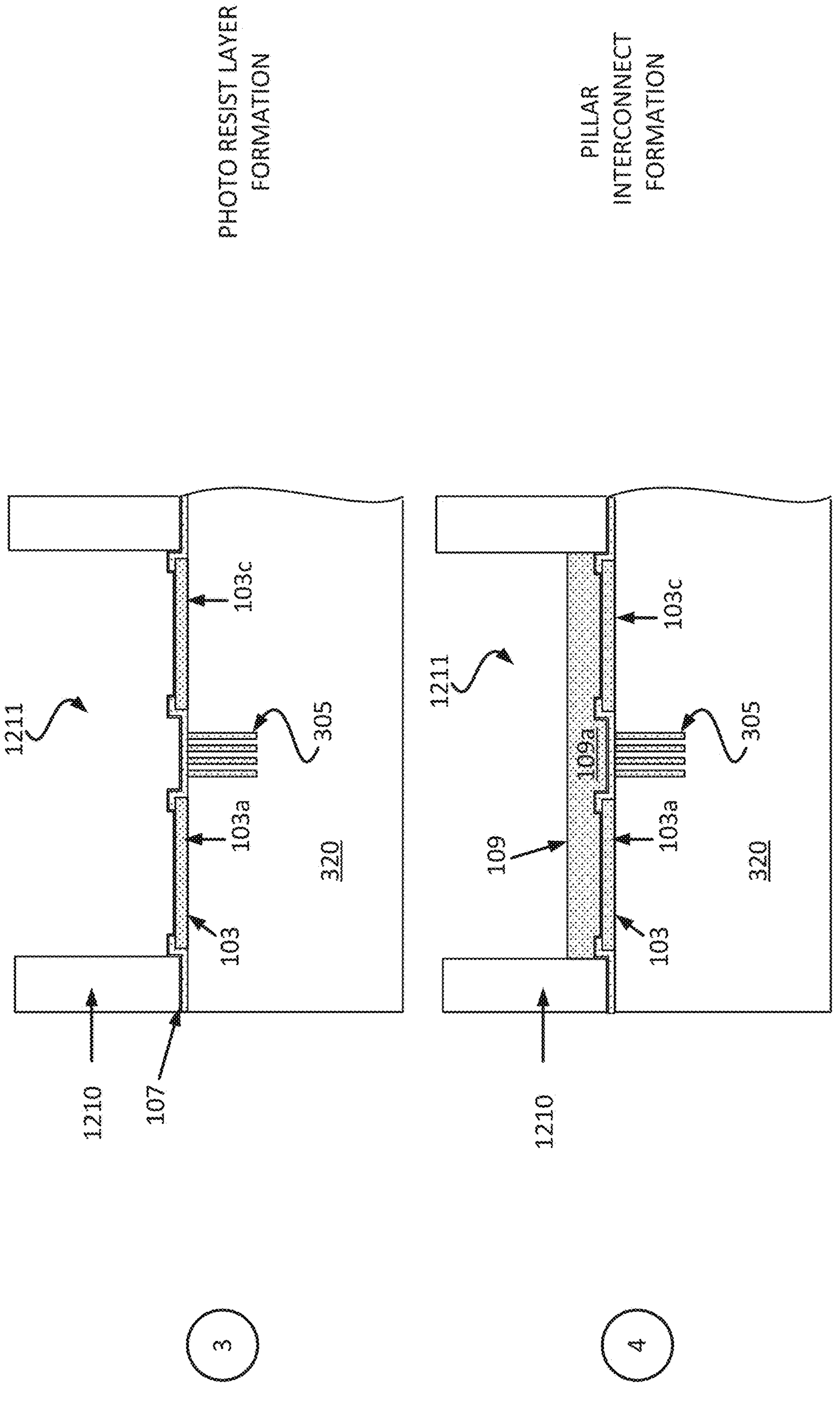
Figure 12C:
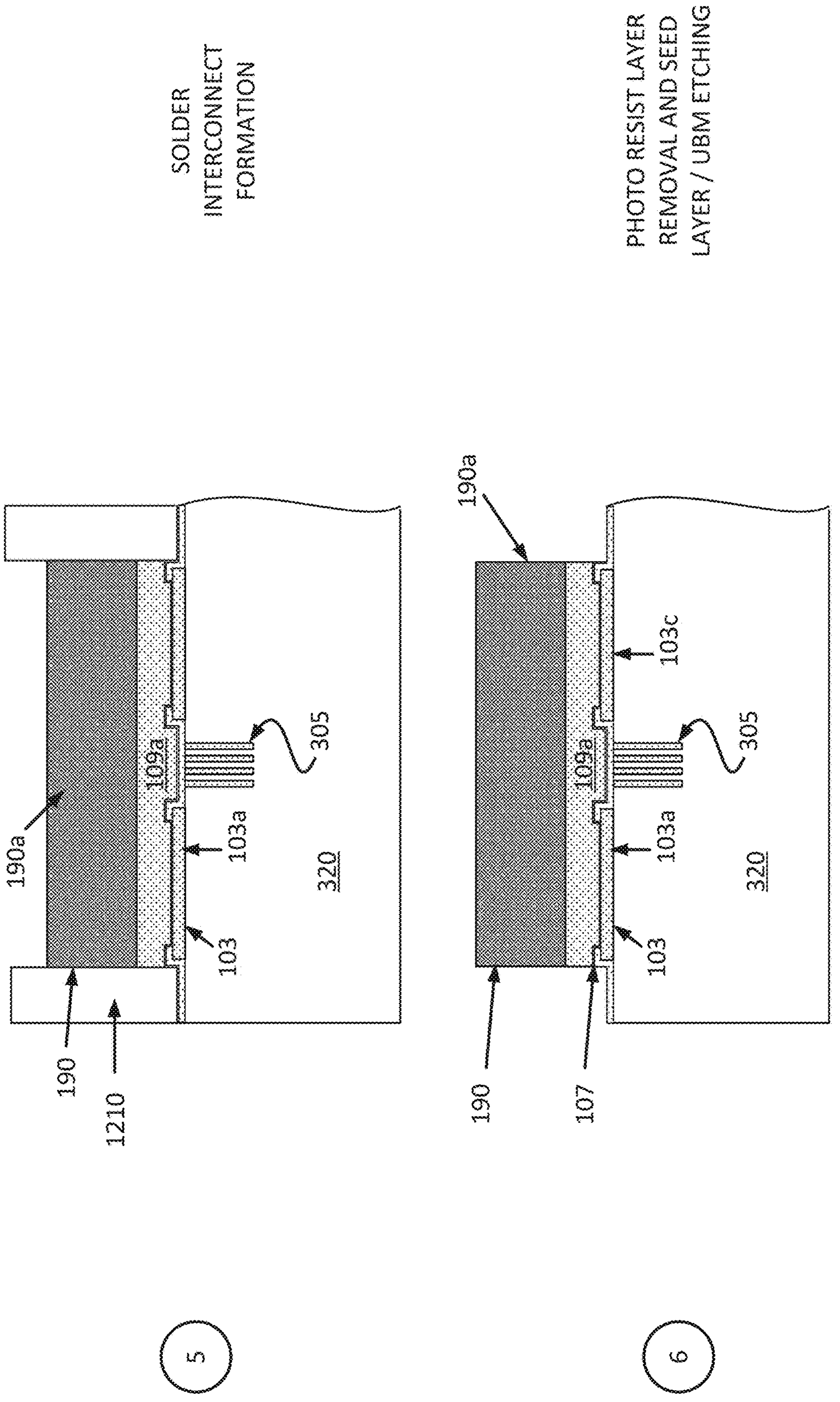

In some implementations, fabricating a passive device includes several processes. FIGS. 12A-12C illustrate an exemplary sequence for providing or fabricating a passive device comprising a wall pillar interconnect. In some implementations, the sequence of FIGS. 12A-12C may be used to provide or fabricate the passive device 300. However, the process of FIGS. 12A-12C may be used to fabricate the device 100 and/or other passive devices described in the disclosure.

It should be noted that the sequence of FIGS. 12A-12C may combine one or more stages in order to simplify and/or clarify the sequence for providing or fabricating a passive device. In some implementations, the order of the processes may be changed or modified. In some implementations, one or more of processes may be replaced or substituted without departing from the scope of the disclosure.

Stage 1, as shown in FIG. 12A, illustrates a state after a wafer 1200 is provided. The wafer 1200 may include a die substrate 320, a plurality of trench capacitors 305, a plurality of pad interconnects 103 (e.g., pad interconnect 103*a*, 103*b*, 103*c*) and a passivation layer 106. The pad interconnect 103*a*, the pad interconnect 103*b* and the pad interconnect 103*c* are each separate pad interconnects.

Stage 2 illustrates a state after a seed layer is formed over the wafer 1200. The seed layer may be an under bump metallization interconnect 107 (e.g., plurality of under bump metallization interconnects 107). The seed layer may be formed over the passivation layer 106 and the plurality of pad interconnects 103. The seed layer may include copper (Cu). A sputtering process may be used to form the seed layer.

Stage 3, as shown in FIG. 12B, illustrates a state after a photo resist layer 1210 is formed over the wafer 1200. For example, the photo resist layer 1210 may be formed over the seed layer (e.g., over the under bump metallization interconnect 107). The photo resist layer 1210 may be patterned to include a plurality of openings 1211 in the photo resist layer 1210. The photo resist layer 1210 may be coated over the wafer 1200. A photolithography process may be used to form and define the pattern of the photo resist layer 1210. For example, an exposure process and development process may be used to form the plurality of openings 1211 in the photo resist layer 1210. The plurality of openings 1211 may be located over the plurality of pad interconnects 103.

Stage 4 illustrates a state after the plurality of pillar interconnects 109 are formed and coupled to the plurality of under bump metallization interconnects 107. A plating process may be used to form the plurality of pillar interconnects 109. The plurality of pillar interconnects 109 may be formed in the plurality of openings 1211 of the photo resist layer 1210. The plurality of pillar interconnects 109 may include wall pillar interconnects (e.g., 109). The pillar interconnect 109*a* may vertically overlap with the pad interconnect 103*a* and the pad interconnect 103*c*. The pillar interconnect 109*a* may be coupled to the pad interconnect 103*a* and the pad interconnect 103*c*, through an under bump metallization interconnect.

Stage 5, as shown in FIG. 12C, illustrates a state after the plurality of solder interconnects 190 are formed and coupled to the plurality of pillar interconnects 109. The plurality of solder interconnects 190 may be formed through the plurality of openings 1211 of the photo resist layer 1210. A pasting process may be used to form the plurality of solder interconnects 190.

Stage 6 illustrates a state after the photo resist layer 1210 is removed. A strip process may be used to remove the photo resist layer 1210. A portion of the seed layer (e.g., portion of the plurality of under bump metallization interconnects 107) may also be etched and/or removed.

Exemplary Flow Diagram of a Method for Fabricating a Passive Device

Figure 13:
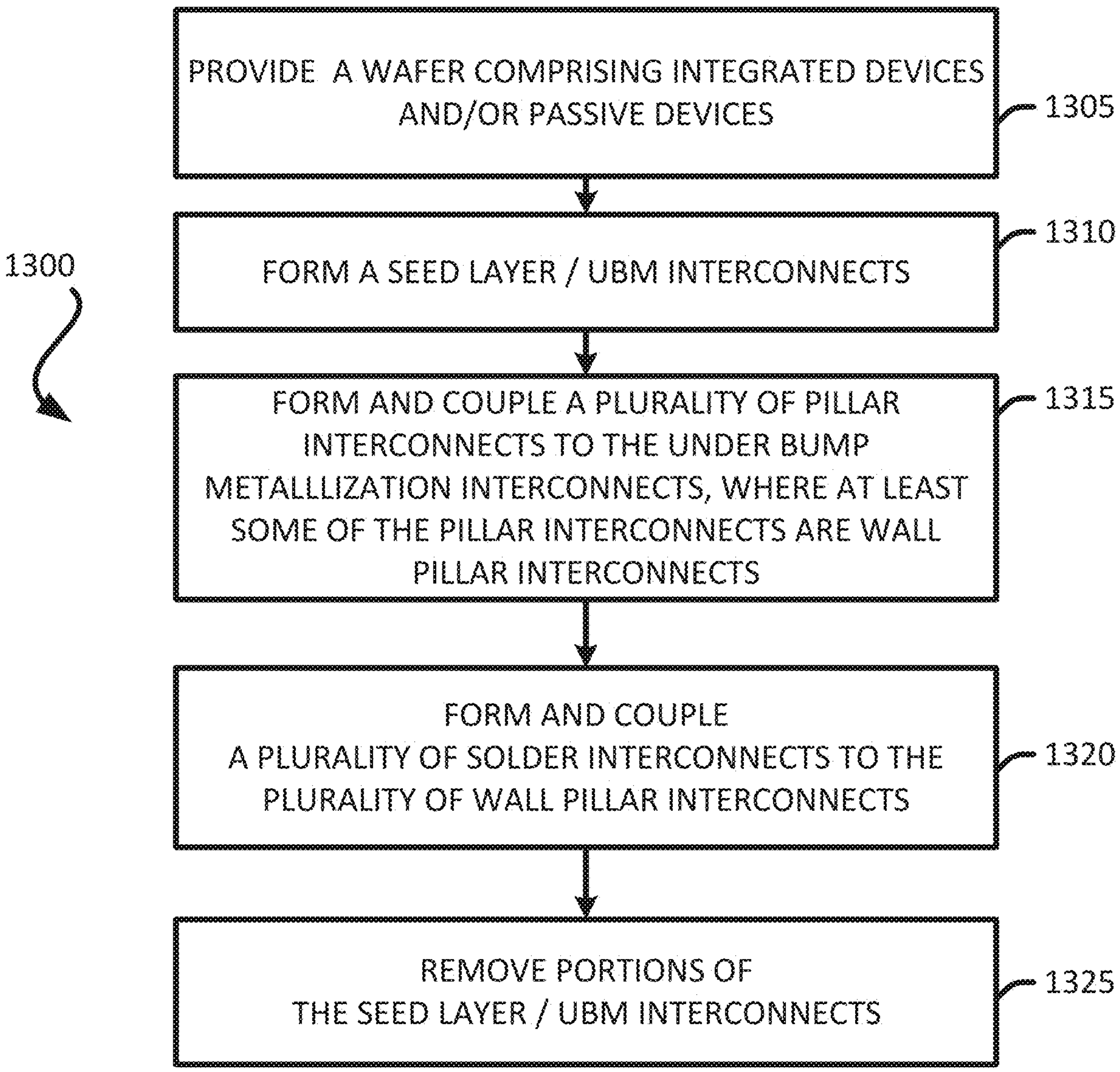
FIG. 13 illustrates an exemplary flow diagram of a method for fabricating a passive device that includes wall pillar interconnects.

In some implementations, fabricating a passive device includes several processes. FIG. 13 illustrates an exemplary flow diagram of a method 1300 for providing or fabricating a passive device. In some implementations, the method 1300 of FIG. 13 may be used to provide or fabricate the passive device 300 of FIG. 3 described in the disclosure. However, the method 1300 may be used to provide or fabricate the device 100 or any other passive devices described in the disclosure.

It should be noted that the method 1300 of FIG. 13 may combine one or more processes in order to simplify and/or clarify the method for providing or fabricating an integrated device. In some implementations, the order of the processes may be changed or modified.

The method provides (at 1305) a wafer that includes passive devices and/or integrated devices. Stage 1, as shown in FIG. 12A, illustrates and describes an example of a state after a wafer 1200 is provided. The wafer 1200 may include a die substrate 320, a plurality of trench capacitors 305, a plurality of pad interconnects 103 (e.g., pad interconnect 103*a*, 103*b*, 103*c*) and a passivation layer 106.

The method forms (at 1310) a seed layer and/or an under bump metallization interconnects. Stage 2 of FIG. 12A, illustrates and describes an example of a state after a seed layer is formed over the wafer 1200. The seed layer may be an under bump metallization interconnect 107 (e.g., plurality of under bump metallization interconnects 107). The seed layer may be formed over the passivation layer 106 and the plurality of pad interconnects 103. The seed layer may include copper (Cu). A sputtering process may be used to form the seed layer.

The method forms (at 1315) a plurality of pillar interconnects that are coupled to the plurality of under bump metallization interconnects, where some of the pillar interconnects are wall pillar interconnects. Stage 3 of FIG. 12B, illustrates and describes an example of a state after a photo resist layer 1210 is formed over the wafer 1200. For example, the photo resist layer 1210 may be formed over the seed layer (e.g., over the under bump metallization interconnect 107). The photo resist layer 1210 may be patterned to include a plurality of openings 1211 in the photo resist layer 1210. The photo resist layer 1210 may be coated over the wafer 1200. A photolithography process may be used to form and define the pattern of the photo resist layer 1210. For example, an exposure process and development process may be used to form the plurality of openings 1211 in the photo resist layer 1210. The plurality of openings 1211 may be located over the plurality of pad interconnects 103.

Stage 4 of FIG. 12B, illustrates and describes an example of a state after the plurality of pillar interconnects 109 are formed and coupled to the plurality of under bump metallization interconnects 107. A plating process may be used to form the plurality of pillar interconnects 109. The plurality of pillar interconnects 109 may be formed in the plurality of openings 1211 of the photo resist layer 1210. The plurality of pillar interconnects 109 may include wall pillar interconnects (e.g., 109). The pillar interconnect 109*a* may vertically overlap with the pad interconnect 103*a* and the pad interconnect 103*c*. The pillar interconnect 109*a* may be coupled to the pad interconnect 103*a* and the pad interconnect 103*c*, through an under bump metallization interconnect.

The method couples (at 1320) a plurality of solder interconnects to the plurality of pillar interconnects. Stage 5 of FIG. 12C, illustrates and describes an example of a state after the plurality of solder interconnects 190 are formed and coupled to the plurality of pillar interconnects 109. The plurality of solder interconnects 190 may be formed through the plurality of openings 1211 of the photo resist layer 1210. A pasting process may be used to form the plurality of solder interconnects 190.

The method removes (at 1325) a portion of the seed layer and/or the plurality of under bump metallization interconnects. Stage 6 of FIG. 12C, illustrates and describes an example of a state after the photo resist layer 1210 is removed. A strip process may be used to remove the photo resist layer 1210. A portion of the seed layer (e.g., portion of the plurality of under bump metallization interconnects 107) may be etched and/or removed.

Exemplary Electronic Devices

Figure 14:
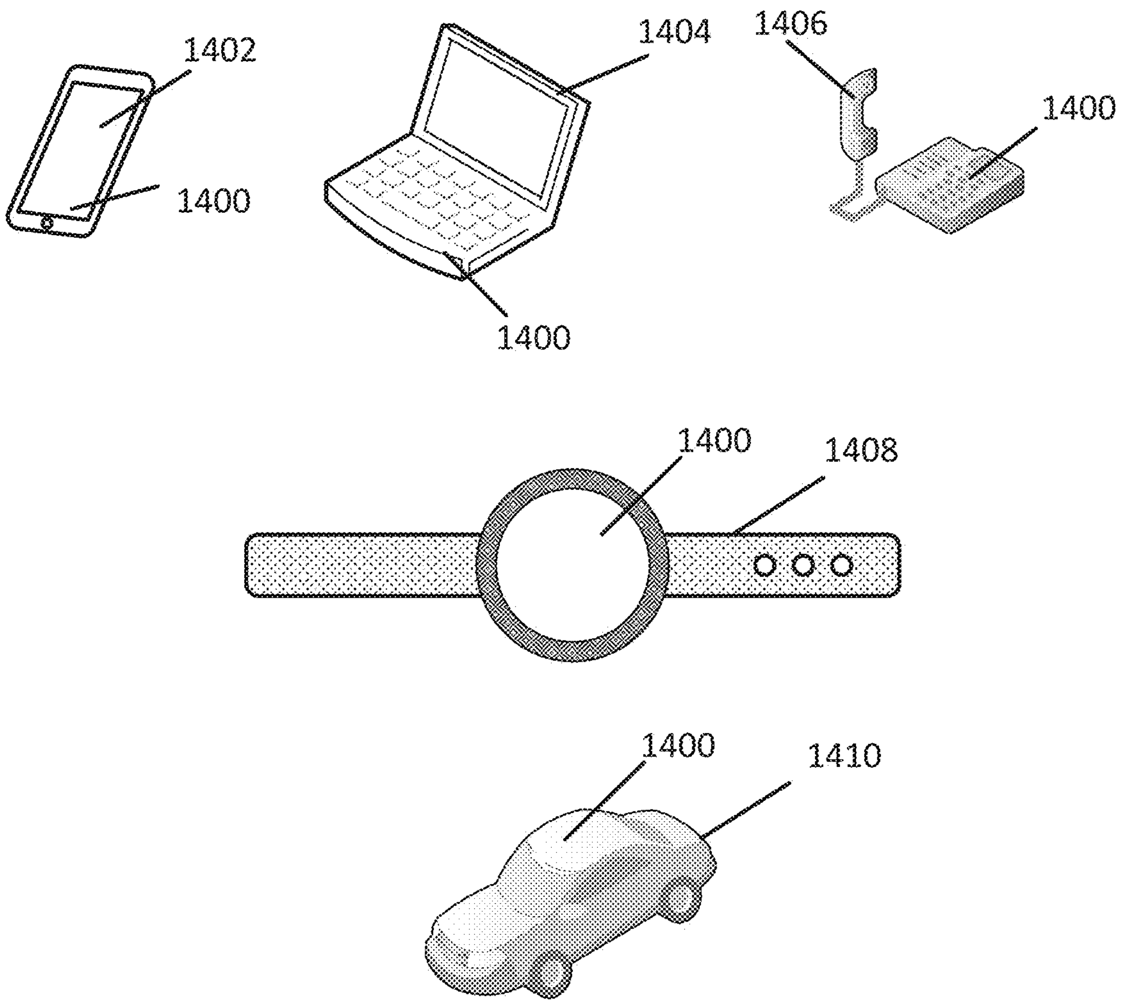
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-11, 12A-12C, and 13-14 may be rearranged and/or combined into a single component, process, feature or function or embodied in several components, processes, or functions. Additional elements, components, processes, and/or functions may also be added without departing from the disclosure. It should also be noted FIGS. 1-11, 12A-12C, and 13-14 and its corresponding description in the present disclosure is not limited to dies and/or ICs. In some implementations, FIGS. 1-11, 12A-12C, and 13-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace (e.g., trace interconnect), a via (e.g., via interconnect), a pad (e.g., pad interconnect), a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A device comprising a die substrate; a plurality of under bump metallization interconnects; and a plurality of pillar interconnects coupled to the plurality of under bump metallization interconnects, wherein at least one pillar interconnect comprises a wall pillar interconnect.

Aspect 2: The device of aspect 1, wherein the plurality of pillar interconnects comprise a first plurality of wall pillar interconnects; and a second plurality of wall pillar interconnects.

Aspect 3: The device of aspect 2, wherein the first plurality of wall pillar interconnects are configured to provide at least one electrical path for power.

Aspect 4: The device of aspects 2 through 3, wherein the second plurality of wall pillar interconnects are configured to provide at least one electrical path for ground.

Aspect 5: The device of aspects 2 through 4, wherein the first plurality of wall pillar interconnects and the second plurality of wall pillar interconnects are interleaved.

Aspect 6: The device of aspects 2 through 5, wherein the first plurality of wall pillar interconnects comprise a first plurality of segmented wall pillar interconnects.

Aspect 7: The device of aspects 2 through 6, wherein the second plurality of wall pillar interconnects comprise a second plurality of segmented wall pillar interconnects.

Aspect 8: The device of aspects 2 through 7, wherein the first plurality of wall pillar interconnects are arranged in a diagonal direction relative to an edge of the device.

Aspect 9: The device of aspects 1 through 8, wherein the plurality of under bump metallization interconnects comprise a plurality of wall under bump metallization interconnects.

Aspect 10: The device of aspects 1 through 9, further comprising a plurality of pad interconnects coupled to the plurality of under bump metallization interconnects.

Aspect 11: The device of aspect 10, wherein the plurality of pad interconnects comprise a first pad and a second pad, wherein the plurality of under bump metallization interconnects comprise a first under bump metallization coupled to the first pad and the second pad, and wherein the wall pillar interconnect vertically overlaps with the first pad and the second pad.

Aspect 12: The device of aspects 1 through 11, further comprising a plurality of trench capacitors.

Aspect 13: The device of aspects 1 through 11, wherein the die substrate includes an active region comprising a plurality of logic cells.

Aspect 14: The device of aspects 13, further comprising a die interconnection portion coupled to the die substrate.

Aspect 15: A package comprising a substrate comprising at least one dielectric layer; and a plurality of interconnects. The package further comprises a passive device coupled to the substrate through a plurality of solder interconnects, wherein the passive device comprises a die substrate; a plurality of under bump metallization interconnects; and a plurality of pillar interconnects coupled to the plurality of under bump metallization interconnects, wherein at least one pillar interconnect comprises a wall pillar interconnect.

Aspect 16: The package of aspect 15, wherein the plurality of pillar interconnects comprise a first plurality of wall pillar interconnects; and a second plurality of wall pillar interconnects.

Aspect 17: The package of aspect 16, wherein the first plurality of wall pillar interconnects and the second plurality of wall pillar interconnects are interleaved.

Aspect 18: The package of aspects 16 through 17, wherein the first plurality of wall pillar interconnects comprise a first plurality of segmented wall pillar interconnects.

Aspect 19: The package of aspects 16 through 18, wherein the first plurality of wall pillar interconnects are arranged in a diagonal direction relative to an edge of the device.

Aspect 20: The package of aspects 15 through 19, wherein the passive device further comprises a plurality of pad interconnects coupled to the plurality of under bump metallization interconnects, wherein the plurality of pad interconnects comprise a first pad and a second pad, wherein the plurality of under bump metallization interconnects comprise a first under bump metallization coupled to the first pad and the second pad, and wherein the wall pillar interconnect vertically overlaps with the first pad and the second pad.

Aspect 21: The package of aspects 15 through 20, wherein the package is incorporated in a device from a group consisting one of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 22: The device of aspects 1 through 14, wherein the device is from a group consisting one of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 23: A package comprising a substrate comprising at least one dielectric layer; and a plurality of interconnects. The package further comprises an integrated device coupled to the substrate through a plurality of solder interconnects, wherein the integrated device comprises a die substrate; a plurality of under bump metallization interconnects; and a plurality of pillar interconnects coupled to the plurality of under bump metallization interconnects, wherein at least one pillar interconnect comprises a wall pillar interconnect.

Aspect 24: The package of aspect 23, wherein the plurality of pillar interconnects comprise a first plurality of wall pillar interconnects; and a second plurality of wall pillar interconnects.

Aspect 25: The package of aspect 24, wherein the first plurality of wall pillar interconnects and the second plurality of wall pillar interconnects are interleaved.

Aspect 26: The package of aspects 24 through 25, wherein the first plurality of wall pillar interconnects comprise a first plurality of segmented wall pillar interconnects.

Aspect 27: The package of aspects 24 through 26, wherein the first plurality of wall pillar interconnects are arranged in a diagonal direction relative to an edge of the device.

Aspect 28: The package of aspects 23 through 27, wherein the integrated device further comprises a plurality of pad interconnects coupled to the plurality of under bump metallization interconnects, wherein the plurality of pad interconnects comprise a first pad and a second pad, wherein the plurality of under bump metallization interconnects comprise a first under bump metallization coupled to the first pad and the second pad, and wherein the wall pillar interconnect vertically overlaps with the first pad and the second pad.

Aspect 29: The package of aspects 23 through 28, wherein the package is incorporated in a device from a group consisting one of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:

a die substrate;

a plurality of under bump metallization interconnects; and a plurality of pillar interconnects coupled to the plurality of under bump metallization interconnects, wherein at least one pillar interconnect comprises a wall pillar interconnect.

2. The device of claim 1, wherein the plurality of pillar interconnects comprise:

a first plurality of wall pillar interconnects; and a second plurality of wall pillar interconnects.

3. The device of claim 2, wherein the first plurality of wall pillar interconnects are configured to provide at least one electrical path for power.

4. The device of claim 2, wherein the second plurality of wall pillar interconnects are configured to provide at least one electrical path for ground.

5. The device of claim 2, wherein the first plurality of wall pillar interconnects and the second plurality of wall pillar interconnects are interleaved.

6. The device of claim 2, wherein the first plurality of wall pillar interconnects comprise a first plurality of segmented wall pillar interconnects.

7. The device of claim 2, wherein the second plurality of wall pillar interconnects comprise a second plurality of segmented wall pillar interconnects.

8. The device of claim 2, wherein the first plurality of wall pillar interconnects are arranged in a diagonal direction relative to an edge of the device.

9. The device of claim 1, wherein the plurality of under bump metallization interconnects comprise a plurality of wall under bump metallization interconnects.

10. The device of claim 1, further comprising a plurality of pad interconnects coupled to the plurality of under bump metallization interconnects.

11. The device of claim 10, wherein the plurality of pad interconnects comprise a first pad and a second pad, wherein the plurality of under bump metallization interconnects comprise a first under bump metallization coupled to the first pad and the second pad, and wherein the wall pillar interconnect vertically overlaps with the first pad and the second pad.

12. The device of claim 1, further comprising a plurality of trench capacitors.

13. The device of claim 1, wherein the die substrate includes an active region comprising a plurality of logic cells.

14. The device of claim 1, further comprising a die interconnection portion coupled to the die substrate.

15. A package comprising:

a substrate comprising:

at least one dielectric layer; and a plurality of interconnects; and a passive device coupled to the substrate through a plurality of solder interconnects, wherein the passive device comprises:

a die substrate;

a plurality of under bump metallization interconnects; and a plurality of pillar interconnects coupled to the plurality of under bump metallization interconnects, wherein at least one pillar interconnect comprises a wall pillar interconnect.

16. The package of claim 15, wherein the plurality of pillar interconnects comprise:

a first plurality of wall pillar interconnects; and a second plurality of wall pillar interconnects.

17. The package of claim 16, wherein the first plurality of wall pillar interconnects and the second plurality of wall pillar interconnects are interleaved.

18. The package of claim 16, wherein the first plurality of wall pillar interconnects comprise a first plurality of segmented wall pillar interconnects.

19. The package of claim 16, wherein the first plurality of wall pillar interconnects are arranged in a diagonal direction relative to an edge of the device.

20. The package of claim 15, wherein the passive device further comprises a plurality of pad interconnects coupled to the plurality of under bump metallization interconnects, wherein the plurality of pad interconnects comprise a first pad and a second pad, wherein the plurality of under bump metallization interconnects comprise a first under bump metallization coupled to the first pad and the second pad, and wherein the wall pillar interconnect vertically overlaps with the first pad and the second pad.

* * * * *